United States Patent
Check

(10) Patent No.: US 10,804,452 B2
(45) Date of Patent: Oct. 13, 2020

(54) INTERCONNECTS FOR LIGHT EMITTING DIODE CHIPS

(71) Applicant: Cree, Inc., Durham, NC (US)

(72) Inventor: Michael Check, Apex, NC (US)

(73) Assignee: Cree, Inc., Durham, NC (US)

(*) Notice: Subject to any disclaimer, the term of this patent is extended or adjusted under 35 U.S.C. 154(b) by 0 days.

(21) Appl. No.: 16/222,173

(22) Filed: Dec. 17, 2018

(65) Prior Publication Data

US 2020/0194644 A1 Jun. 18, 2020

(51) Int. Cl.
*H01L 33/62* (2010.01)
*H01L 23/00* (2006.01)
(Continued)

(52) U.S. Cl.
CPC .............. *H01L 33/62* (2013.01); *H01L 24/06* (2013.01); *H01L 33/0008* (2013.01);
(Continued)

(58) Field of Classification Search
CPC ... H01L 33/0008; H01L 33/10; H01L 33/405; H01L 33/46; H01L 33/60; H01L 33/62; H01L 24/06; H01L 2224/0603; H01L 2224/0615; H01L 2224/06151; H01L 2224/06152; H01L 2224/0616
See application file for complete search history.

(56) References Cited

U.S. PATENT DOCUMENTS 5,739,554 A 4/1998 Edmond et al.
6,657,236 B1 12/2003 Thibeault et al.
(Continued)

FOREIGN PATENT DOCUMENTS

| CN | 107452846 A | 12/2017 |
|---|---|---|
| CN | 107546303 A | 1/2018 |
| WO | 2012086483 A1 | 6/2012 |

OTHER PUBLICATIONS

Author Unknown, "Cree® XLamp® XB-D and XT-E LED Optical Design Considerations," Application Note, CLD-AP104 Rev 0B, www.cree.com/Xlamp, 2014, Cree, Inc., pp. 1-15.
(Continued)

*Primary Examiner* — Stephen W Smoot

(74) *Attorney, Agent, or Firm* — Withrow & Terranova, P.L.L.C.

(57) ABSTRACT

Solid-state lighting devices including light-emitting diodes (LEDs) and more particularly LED chips with interconnect structures are disclosed. LED chips are provided that include first interconnects electrically coupled to an n-type layer and second interconnects electrically connected to a p-type layer. Configurations of the first and second interconnects are provided that may improve current spreading by reducing localized areas of current crowding within LED chips. Various configurations are disclosed that include collectively formed symmetric patterns of the first and second interconnects, diameters of certain ones of either the first or second interconnects that vary based on their relative positions in LED chips, and spacings of the second interconnects that vary based on their distances from the first interconnects. In this regard, LED chips are disclosed with improved current spreading as well as higher lumen outputs and efficiencies.

23 Claims, 11 Drawing Sheets

(51) Int. Cl.
*H01L 33/00* (2010.01)
*H01L 33/46* (2010.01)
*H01L 33/60* (2010.01)

(52) U.S. Cl.
CPC .............. *H01L 33/46* (2013.01); *H01L 33/60* (2013.01); *H01L 2224/0603* (2013.01); *H01L 2224/06151* (2013.01); *H01L 2224/06152* (2013.01)

(56) References Cited

U.S. PATENT DOCUMENTS

| | | | |
|---|---|---|---|
| 6,747,298 B2 | 6/2004 | Slater, Jr. et al. | |
| 6,784,462 B2 | 8/2004 | Schubert | |
| 6,791,119 B2 | 9/2004 | Slater, Jr. et al. | |
| 6,821,804 B2 | 11/2004 | Thibeault et al. | |
| 6,888,167 B2 | 5/2005 | Slater, Jr. et al. | |
| 7,211,803 B1 | 5/2007 | Dhurjaty et al. | |
| 7,326,967 B2 | 2/2008 | Hsieh et al. | |
| 7,622,746 B1 | 11/2009 | Lester et al. | |
| 7,829,906 B2 | 11/2010 | Donofrio | |
| 7,880,181 B2* | 2/2011 | Yoon | H01L 33/382 257/88 |
| 7,915,629 B2 | 3/2011 | Li et al. | |
| 8,017,963 B2 | 9/2011 | Donofrio et al. | |
| 8,212,273 B2 | 7/2012 | McKenzie et al. | |
| 8,368,100 B2 | 2/2013 | Donofrio et al. | |
| 8,471,280 B2* | 6/2013 | Aldaz | H01L 33/60 257/98 |
| 8,575,633 B2 | 11/2013 | Donofrio et al. | |
| 8,598,609 B2 | 12/2013 | Ibbetson et al. | |
| 8,643,039 B2 | 2/2014 | Donofrio et al. | |
| 8,680,556 B2 | 3/2014 | Ibbetson et al. | |
| 8,710,536 B2 | 4/2014 | Ibbetson et al. | |
| 8,866,169 B2 | 10/2014 | Emerson et al. | |
| 8,940,561 B2 | 1/2015 | Donofrio et al. | |
| 9,000,470 B2 | 4/2015 | Tudorica et al. | |
| 9,070,850 B2 | 6/2015 | Keller et al. | |
| 9,362,459 B2 | 6/2016 | Heikman et al. | |
| 9,412,907 B1 | 8/2016 | Place et al. | |
| 9,461,201 B2 | 10/2016 | Heikman et al. | |
| 9,887,327 B2 | 2/2018 | Reiherzer et al. | |
| 2003/0025212 A1 | 2/2003 | Bhat et al. | |
| 2003/0230754 A1 | 12/2003 | Steigerwald et al. | |
| 2005/0255619 A1 | 11/2005 | Negro et al. | |
| 2008/0179611 A1 | 7/2008 | Chitnis et al. | |
| 2008/0246047 A1 | 10/2008 | Hsu et al. | |
| 2009/0146165 A1 | 6/2009 | Hasnain et al. | |
| 2009/0283787 A1 | 11/2009 | Donofrio et al. | |
| 2010/0140635 A1 | 6/2010 | Ibbetson et al. | |
| 2011/0305021 A1* | 12/2011 | Xin | H01L 25/0753 362/249.02 |
| 2012/0049219 A1* | 3/2012 | Kamiya | H01L 33/382 257/98 |
| 2012/0049756 A1* | 3/2012 | Schubert | H01L 33/38 315/291 |
| 2012/0074441 A1 | 3/2012 | Seo et al. | |
| 2012/0193660 A1 | 8/2012 | Donofrio et al. | |
| 2012/0193662 A1 | 8/2012 | Donofrio et al. | |
| 2012/0326159 A1 | 12/2012 | Bergmann et al. | |
| 2013/0058102 A1 | 3/2013 | Lin | |
| 2013/0141920 A1 | 6/2013 | Emerson et al. | |
| 2013/0264592 A1 | 10/2013 | Bergmann et al. | |
| 2013/0328096 A1 | 12/2013 | Donofrio et al. | |
| 2013/0341634 A1 | 12/2013 | Heikman et al. | |
| 2014/0070245 A1 | 3/2014 | Haberern et al. | |
| 2014/0203320 A1 | 7/2014 | Ibbetson et al. | |
| 2015/0140710 A1 | 5/2015 | McLaurin et al. | |
| 2015/0179879 A1 | 6/2015 | Yang et al. | |
| 2015/0179903 A1 | 6/2015 | Pun et al. | |
| 2015/0295138 A1 | 10/2015 | Chae et al. | |
| 2015/0380621 A1 | 12/2015 | Chae et al. | |
| 2016/0155901 A1 | 6/2016 | Lopez et al. | |
| 2016/0211420 A1 | 7/2016 | Donofrio et al. | |
| 2017/0012175 A1 | 1/2017 | Wang et al. | |
| 2017/0084787 A1 | 3/2017 | Emura et al. | |
| 2017/0098746 A1 | 4/2017 | Bergmann et al. | |
| 2017/0149211 A1 | 5/2017 | Jeong et al. | |
| 2017/0210277 A1* | 7/2017 | Harada | H01L 33/20 |
| 2017/0108173 A1 | 8/2017 | Kim et al. | |
| 2017/0331009 A1 | 11/2017 | Shioji | |
| 2018/0114878 A1 | 4/2018 | Danesh et al. | |
| 2019/0237630 A1 | 8/2019 | Check | |

OTHER PUBLICATIONS

Bruschi, Lorenzo et al., "Adsorption in alumina pores open at one and at both ends," Nanoscale, vol. 7, Issue 6, Feb. 14, 2015, Royal Society of Chemistry, pp. 2587-2596.

Bruschi, Lorenzo et al., "Supporting Information: Adsorption in alumina pores open at one and at both ends," Electronic Supplementary Material (ESI) for Nanoscale, 2014, http://www.rsc.org/suppdata/nr/c4/c4nr06469k/c4nr06469k1.pdf, Royal Society of Chemistry, 3 pages.

Carey, Julian, "New LED architectures and phosphor technologies lower costs and boost quality," (Magazine), LED Design & Manufacturing, vol. 11, Issue 7, Sep. 4, 2014, Tulsa, OK, PennWell Corporation, pp. 1-16.

Kim, Jong Kyu et al., "GaInN light-emitting diodes with $RuO_2/SiO_2/Ag$ omni-directional reflector," Applied Physics Letters, vol. 84, Issue 22, May 31, 2004, American Institute of Physics, pp. 4508-4510.

Palik, E. D., ed., "Handbook of Optical Constants of Solids: Volume One," Academic Press, 1985, 785 pages.

Wright, Maury, "Strategies in Light to span SSL technology and business domains," (Magazine), SSL Design, vol. 12, Issue 2, Feb. 16, 2015, Tulsa, OK, PennWell Corporation, pp. 1-22.

Zhao, S. et al., "Enhanced luminous efficiency of phosphor-converted LEDs by using back reflector to increase reflectivity for yellow light," Applied Optics, vol. 53, No. 34, Dec. 1, 2014, Optical Society of America, pp. 8104-8110.

Zhao Y.S. et al., "Efficiency Enhancement of InGaN/GaN Light-Emitting Diodes with a Back-Surface Distributed Bragg Reflector," Journal of Electronic Materials, vol. 32, No. 12, 2003, Springer-Verlag, pp. 1523-1526.

Non-Final Office Action for U.S. Appl. No. 15/280,438, dated May 8, 2018, 26 pages.

Final Office Action for U.S. Appl. No. 15/280,438, dated Nov. 1, 2018, 26 pages.

Advisory Action, Interview Summary, and AFCP 2.0 Decision for U.S. Appl. No. 15/280,438, dated Dec. 13, 2018, 7 pages.

Non-Final Office Action and Examiner-Initiated Interview Summary for U.S. Appl. No. 15/280,438, dated May 3, 2019, 23 pages.

Final Office Action and Examiner-Initiated Interview Summary for U.S. Appl. No. 15/280,438, dated Sep. 13, 2019, 23 pages.

Advisory Action, Interview Summary, and AFCP 2.0 Decision for U.S. Appl. No. 15/280,438, dated Nov. 27, 2019, 6 pages.

Examination Report for European Patent Application No. 16778642.5, dated Apr. 26, 2019, 5 pages.

International Search Report and Written Opinion for International Patent Application No. PCT/US2016/054372, dated Dec. 19, 2016, 16 pages.

International Preliminary Report on Patentability for International Patent Application No. PCT/US2016/054372, dated Apr. 3, 2018, 9 pages.

Non-Final Office Action for U.S. Appl. No. 15/882,103, dated Aug. 20, 2019, 16 pages.

International Search Report and Written Opinion for International Patent Application No. PCT/US2019/015418, dated May 14, 2019, 19 pages.

Non-Final Office Action for U.S. Appl. No. 15/280,438, dated Jan. 22, 2020, 17 pages.

Final Office Action for U.S. Appl. No. 15/882,103, dated Feb. 6, 2020, 23 pages.

Advisory Action, Examiner-Initiated Interview Summary, and AFCP 2.0 Decision for U.S. Appl. No. 15/882,103, dated Mar. 16, 2020, 7 pages.

(56) References Cited

OTHER PUBLICATIONS

Notification of First Office Action for Chinese Patent Application No. 201680070374.8, dated Feb. 6, 2020, 13 pages.
Intention to Grant for European Patent Application No. 16778642.5, dated Feb. 27, 2020, 93 pages.
International Search Report and Written Opinion for International Patent Application No. PCT/US2019/059331, dated Jan. 27, 2020, 19 pages.
Non-Final Office Action and Examiner-Initiated Interview Summary for U.S. Appl. No. 15/280,438, dated Jul. 7, 2020, 22 pages.
Non-Final Office Action for U.S. Appl. No. 15/882,103, dated Jun. 15, 2020, 14 pages.
Non-Final Office Action for U.S. Appl. No. 15/882,103, dated Jun. 17, 2020, 14 pages.
Non-Final Office Action for U.S. Appl. No. 16/357,949, dated Jun. 10, 2020, 10 pages.

\* cited by examiner

INTERCONNECTS FOR LIGHT EMITTING DIODE CHIPS

FIELD OF THE DISCLOSURE

The present disclosure relates to solid-state lighting devices including light-emitting diodes (LEDs) and more particularly to LED chips and related methods.

BACKGROUND

Solid-state lighting devices such as light-emitting diodes (LEDs) are increasingly used in both consumer and commercial applications. Advancements in LED technology have resulted in highly efficient and mechanically robust light sources with a long service life. Accordingly, modern LEDs have enabled a variety of new display applications and are being increasingly utilized for general illumination applications, often replacing incandescent and fluorescent light sources.

LEDs are solid-state devices that convert electrical energy to light and generally include one or more active layers of semiconductor material (or an active region) arranged between oppositely doped n-type and p-type layers. When a bias is applied across the doped layers, holes and electrons are injected into the one or more active layers where they recombine to generate emissions such as visible light or ultraviolet emissions. An active region may be fabricated, for example, from silicon carbide, gallium nitride, gallium phosphide, aluminum nitride, and/or gallium arsenide-based materials and/or from organic semiconductor materials. Photons generated by the active region are initiated in all directions.

Typically, it is desirable to operate LEDs at the highest light emission efficiency, which can be measured by the emission intensity in relation to the output power (e.g., in lumens per watt). A practical goal to enhance emission efficiency is to maximize extraction of light emitted by the active region in the direction of the desired transmission of light. Light extraction and external quantum efficiency of an LED can be limited by a number of factors, including internal reflection. According to the well-understood implications of Snell's law, photons reaching the surface (interface) between an LED surface and the surrounding environment will be either refracted or internally reflected. If photons are internally reflected in a repeated manner, then such photons will eventually be absorbed and never provide visible light that exits an LED. To increase the opportunity for photons to exit an LED, it has been found useful to pattern, roughen, or otherwise texture the interface between an LED surface and the surrounding environment to provide a varying surface that increases the probability of refraction over internal reflection and thus enhances light extraction. Reflective surfaces may also be provided to reflect generated light so that such light may contribute to useful emission from an LED chip. LEDs have been developed with internal reflective surfaces or layers to reflect generated light.

The quantum efficiency of an LED can also be limited by other factors, such as how well current is able to spread within an LED. To increase current spreading for LEDs, and in particular for larger area LEDs, it has been found useful to add layers of high electrical conductivity over one or more epitaxial layers of an LED. Additionally, electrodes for the LEDs can have larger surface area and may include various electrode extensions or fingers that are configured to route and more evenly distribute current across an LED.

As advancements in modern LED technology progress, the art continues to seek improved LEDs and solid-state lighting devices having desirable illumination characteristics capable of overcoming challenges associated with conventional lighting devices.

SUMMARY

The present disclosure relates to solid-state lighting devices including light-emitting diodes (LEDs) and more particularly to LED chips with interconnect structures. LED chips as disclosed herein may include first interconnects electrically coupled to an n-type layer and second interconnects electrically connected to a p-type layer. Configurations of the first and second interconnects are provided that may improve current spreading by reducing localized areas of current crowding within LED chips. In certain embodiments, the first and second interconnects collectively form symmetric patterns. In certain embodiments, diameters of certain ones of either the first and second interconnects may vary based on their relative positions in LED chips. In certain embodiments, spacings of second interconnects may vary based on their distances from first interconnects. In this regard, LED chips are disclosed with improved current spreading as well as higher lumen outputs and efficiencies.

In one aspect, an LED chip comprises: an active LED structure comprising an n-type layer, a p-type layer, and an active layer arranged between the n-type layer and the p-type layer; a plurality of first interconnects electrically connected to the n-type layer; and a plurality of second interconnects electrically connected to the p-type layer, wherein the plurality of first interconnects and the plurality of second interconnects collectively form a symmetric pattern across an area of the LED chip. In certain embodiments, the LED chip may further comprise an n-contact electrically connected to the n-type layer, wherein the plurality of first interconnects comprise a plurality of n-contact interconnects that are electrically connected between the n-contact and the n-type layer. In certain embodiments, the LED chip may further comprise a reflective structure on the p-type layer, wherein the reflective structure comprises a dielectric layer and a metal layer, and the plurality of second interconnects comprise a plurality of reflective layer interconnects that extend through a portion of the dielectric layer. In certain embodiments, the plurality of first interconnects are arranged to be evenly spaced from one another in a first pattern across the area of the LED chip and the plurality of second interconnects are arranged to be evenly spaced from one another in a second pattern across the area of the LED chip. The first pattern and the second pattern may collectively form the symmetric pattern across the LED chip. In certain embodiments, diameters of the plurality of second interconnects are different based on a relative position of each individual second interconnect to a particular first interconnect. In certain embodiments, a diameter of an individual second interconnect that is arranged closest to a particular first interconnect is larger than a diameter of another individual second interconnect that is arranged farther from the particular first interconnect. In certain embodiments, a diameter of an individual second interconnect that is arranged closest to a particular first interconnect is smaller than a diameter of another individual second interconnect that is arranged farther from the particular first interconnect. Diameters of the plurality of first interconnects may be different based on a relative position of each individual first interconnect across the area of the LED chip. Diameters of the plurality of first interconnects may progressively decrease in a direction from a perimeter of the LED chip toward a center of the LED chip. In certain embodiments, the plurality of first interconnects and the plurality of second interconnects collectively form an asymmetric pattern in a different area of the LED chip.

In another aspect, an LED chip comprises: an active LED structure comprising an n-type layer, a p-type layer, and an active layer arranged between the n-type layer and the p-type layer; a plurality of first interconnects electrically connected to the n-type layer; and a plurality of second interconnects electrically connected to the p-type layer; wherein a center point of each of the plurality of first interconnects and a center point of each of the plurality of second interconnects form an array of equally spaced center points across the LED chip. In certain embodiments, the LED chip further comprises an n-contact electrically connected to the n-type layer, wherein the plurality of first interconnects comprise a plurality of n-contact interconnects that are electrically connected between the n-contact and the n-type layer. In certain embodiments, the LED chip further comprises a reflective structure on the p-type layer, wherein the reflective structure comprises a dielectric layer and a metal layer, and the plurality of second interconnects comprise a plurality of reflective layer interconnects that extend through a portion of the dielectric layer. In certain embodiments, each of the plurality of first interconnects may comprise a same diameter that is in a range of about 4 microns to about 25 microns. In other embodiments, the plurality of first interconnects may comprise diameters that vary within in a range of about 4 microns to about 25 microns. In certain embodiments, each of the plurality of second interconnects may comprise a same diameter that is in a range of about 2 microns to about 15 microns. In other embodiments, the plurality of second interconnects comprises diameters that vary within in a range of about 2 microns to about 15 microns.

In another aspect, an LED chip comprises: an active LED structure comprising an n-type layer, a p-type layer, and an active layer arranged between the n-type layer and the p-type layer; a first interconnect electrically connected to the n-type layer; and a plurality of second interconnects electrically connected to the p-type layer; wherein diameters of the plurality of second interconnects are different based on a relative position of each individual second interconnect to the first interconnect. The diameters of the plurality of second interconnects may progressively decrease with increasing distance away from the first interconnect. The diameters of the plurality of second interconnects may progressively increase with increasing distance away from the first interconnect. In certain embodiments, the diameters of the plurality of second interconnects progressively increase and decrease with increasing distance away from the first interconnect. In certain embodiments, the LED chip may further comprise a plurality of first interconnects that are arranged to be evenly spaced from one another in a first pattern across an area of the LED chip and the plurality of second interconnects are arranged to be unevenly spaced from one another across the area of the LED chip. In certain embodiments, the LED chip may further comprise a plurality of first interconnects, wherein diameters of the plurality of first interconnects are different based on a relative position of each individual first interconnect across an area of the LED chip.

In another aspect, an LED chip comprises: an active LED structure comprising an n-type layer, a p-type layer, and an active layer arranged between the n-type layer and the p-type layer; a first interconnect electrically connected to the n-type layer; and a plurality of second interconnects electrically connected to the p-type layer; wherein spacings between adjacent second interconnects of the plurality of second interconnects are different based on a relative position of each second interconnect to the first interconnect. In certain embodiments, the LED chip further comprises a reflective structure on the p-type layer, wherein the reflective structure comprises a dielectric layer and a metal layer, and the plurality of second interconnects comprise a plurality of reflective layer interconnects that extend through a portion of the dielectric layer. In certain embodiments, the first interconnect is one of a plurality of first interconnects. The plurality of first interconnects and the plurality of second interconnects collectively form a symmetric pattern or an asymmetric pattern across an area of the LED chip.

In another aspect, any of the foregoing aspects, and/or various separate aspects and features as described herein, may be combined for additional advantage. Any of the various features and elements as disclosed herein may be combined with one or more other disclosed features and elements unless indicated to the contrary herein.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

DETAILED DESCRIPTION

Figure 1:
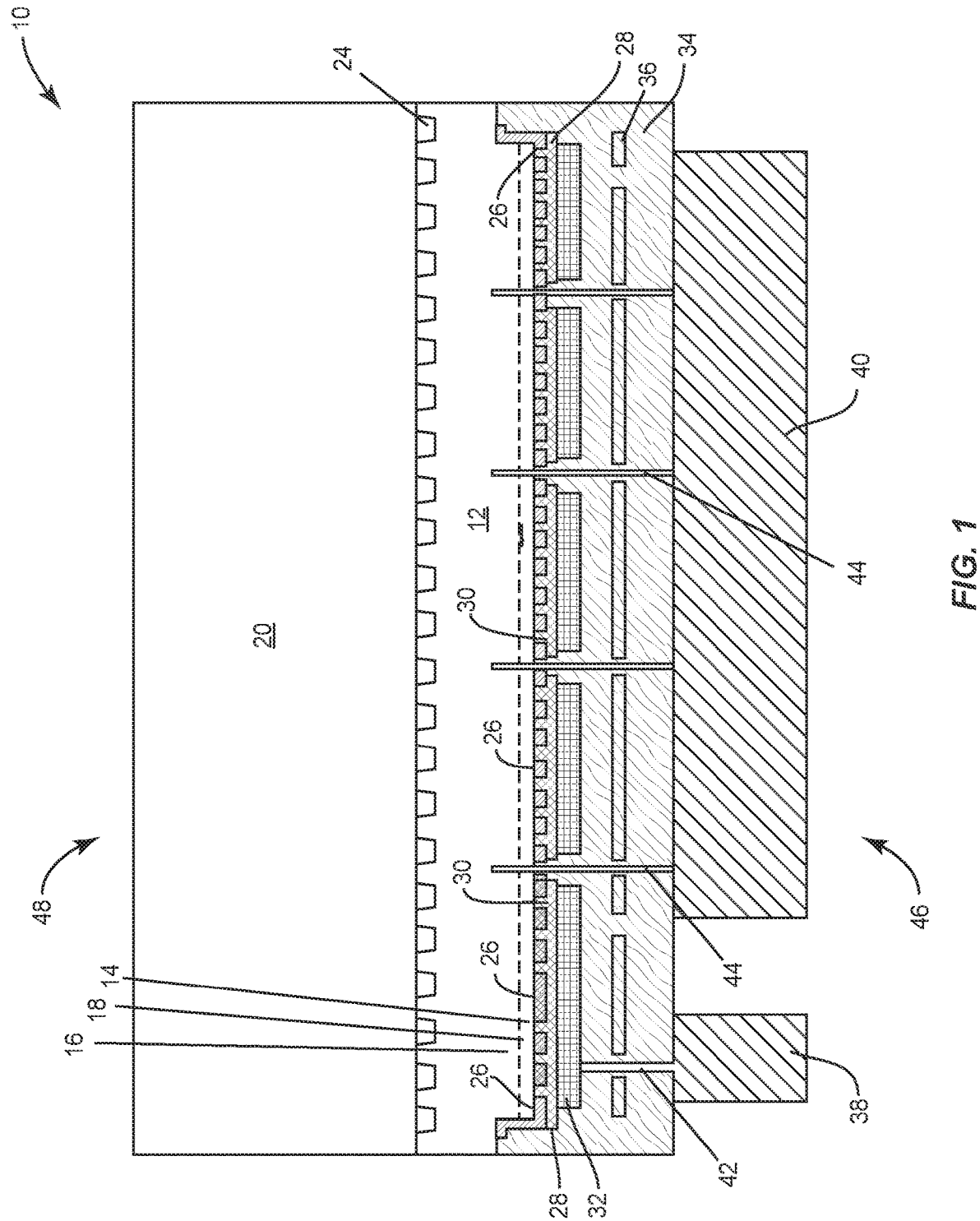
FIG. 1 is a cross-sectional view of a representative light-emitting diode (LED) chip arranged in a flip-chip configuration.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

The present disclosure relates to solid-state lighting devices including light-emitting diodes (LEDs) and more particularly to LED chips with interconnect structures. LED chips as disclosed herein may include first interconnects electrically coupled to an n-type layer and second interconnects electrically connected to a p-type layer. Configurations of the first and second interconnects are provided that may improve current spreading by reducing localized areas of current crowding within LED chips. In certain embodiments, the first and second interconnects collectively form symmetric patterns. In certain embodiments, diameters of certain ones of either the first and second interconnects may vary based on their relative positions in LED chips. In certain embodiments, spacings of second interconnects may vary based on their distances from first interconnects. In this regard, LED chips are disclosed with improved current spreading as well as higher lumen outputs and efficiencies.

An LED chip typically comprises an active LED structure or region that can have many different semiconductor layers arranged in different ways. The fabrication and operation of LEDs and their active structures are generally known in the art and are only briefly discussed herein. The layers of the active LED structure can be fabricated using known processes with a suitable process being fabrication using metal organic chemical vapor deposition. The layers of the active LED structure can comprise many different layers and generally comprise an active layer sandwiched between n-type and p-type oppositely doped epitaxial layers, all of which are formed successively on a growth substrate. It is understood that additional layers and elements can also be included in the active LED structure, including, but not limited to, buffer layers, nucleation layers, super lattice structures, un-doped layers, cladding layers, contact layers, and current-spreading layers and light extraction layers and elements. The active layer can comprise a single quantum well, a multiple quantum well, a double heterostructure, or super lattice structures.

The active LED structure can be fabricated from different material systems, with some material systems being Group III nitride-based material systems. Group III nitrides refer to those semiconductor compounds formed between nitrogen (N) and the elements in Group III of the periodic table, usually aluminum (Al), gallium (Ga), and indium (In). Gallium nitride (GaN) is a common binary compound. Group III nitrides also refer to ternary and quaternary compounds such as aluminum gallium nitride (AlGaN), indium gallium nitride (InGaN), and aluminum indium gallium nitride (AlInGaN). For Group III nitrides, silicon (Si) is a common n-type dopant and magnesium (Mg) is a common p-type dopant. Accordingly, the active layer, n-type layer, and p-type layer may include one or more layers of GaN, AlGaN, InGaN, and AlInGaN that are either undoped or doped with Si or Mg for a material system based on Group III nitrides. Other material systems include silicon carbide (SiC), organic semiconductor materials, and other Group III-V systems such as gallium phosphide (GaP), gallium arsenide (GaAs), and related compounds.

The active LED structure may be grown on a growth substrate that can include many materials, such as sapphire, SiC, aluminum nitride (AlN), GaN, with a suitable substrate being a 4H polytype of SiC, although other SiC polytypes can also be used including 3C, 6H, and 15R polytypes. SiC has certain advantages, such as a closer crystal lattice match to Group III nitrides than other substrates and results in Group III nitride films of high quality. SiC also has a very high thermal conductivity so that the total output power of Group III nitride devices on SiC is not limited by the thermal dissipation of the substrate. Sapphire is another common substrate for Group III nitrides and also has certain advantages, including being lower cost, having established manufacturing processes, and having good light transmissive optical properties.

Different embodiments of the active LED structure can emit different wavelengths of light depending on the composition of the active layer and n-type and p-type layers. In some embodiments, the active LED structure emits blue light with a peak wavelength range of approximately 430 nanometers (nm) to 480 nm. In other embodiments, the active LED structure emits green light with a peak wavelength range of 500 nm to 570 nm. In other embodiments, the active LED structure emits red light with a peak wavelength range of 600 nm to 650 nm.

The LED chip can also be covered with one or more lumiphoric or other conversion materials, such as phosphors, such that at least some of the light from the LED chip is absorbed by the one or more phosphors and is converted to one or more different wavelength spectra according to the characteristic emission from the one or more phosphors. In some embodiments, the combination of the LED chip and the one or more phosphors emits a generally white combination of light. The one or more phosphors may include yellow (e.g., YAG:Ce), green (e.g., LuAg:Ce), and red (e.g., $Ca_{1-x-y}Sr_xEu_yAlSiN_3$) emitting phosphors, and combinations thereof. Lumiphoric materials as described herein may be or include one or more of a phosphor, a scintillator, a lumiphoric ink, a quantum dot material, a day glow tape, and the like. Lumiphoric materials may be provided by any suitable means, for example, direct coating on one or more surfaces of an LED, dispersal in an encapsulant material configured to cover one or more LEDs, and/or coating on one or more optical or support elements (e.g., by powder coating, inkjet printing, or the like). In certain embodiments, lumiphoric materials may be downconverting or upconverting, and combinations of both downconverting and upconverting materials may be provided. In certain embodiments, multiple different (e.g., compositionally different) lumiphoric materials arranged to produce different peak wavelengths may be arranged to receive emissions from one or more LED chips. In some embodiments, one or more phosphors may include yellow phosphor (e.g., YAG:Ce), green phosphor (e.g., LuAg:Ce), and red phosphor (e.g., $Ca_{1-x-y}Sr_xEu_yAlSiN_3$) and combinations thereof. One or more lumiphoric materials may be provided on one or more portions of an LED chip and/or a submount in various configurations. In certain embodiments, one or more surfaces of LED chips may be conformally coated with one or more lumiphoric materials, while other surfaces of such LED chips and/or associated submounts may be devoid of lumiphoric material. In certain embodiments, a top surface of an LED chip may include lumiphoric material, while one or more side surfaces of an LED chip may be devoid of lumiphoric material. In certain embodiments, all or substantially all outer surfaces of an LED chip (e.g., other than contact-defining or mounting surfaces) are coated or otherwise covered with one or more lumiphoric materials. In certain embodiments, one or more lumiphoric materials may be arranged on or over one or more surfaces of an LED chip in a substantially uniform manner. In other embodiments, one or more lumiphoric materials may be arranged on or over one or more surfaces of an LED chip in a manner that is non-uniform with respect to one or more of material composition, concentration, and thickness. In certain embodiments, the loading percentage of one or more lumiphoric materials may be varied on or among one or more outer surfaces of an LED chip. In certain embodiments, one or more lumiphoric materials may be patterned on portions of one or more surfaces of an LED chip to include one or more stripes, dots, curves, or polygonal shapes. In certain embodiments, multiple lumiphoric materials may be arranged in different discrete regions or discrete layers on or over an LED chip.

Light emitted by the active layer or region of an LED chip typically has a lambertian emission pattern. For directional applications, internal mirrors or external reflective surfaces may be employed to redirect as much light as possible toward a desired emission direction. Internal mirrors may include single or multiple layers. Some multi-layer mirrors include a metal reflector layer and a dielectric reflector layer, wherein the dielectric reflector layer is arranged between the metal reflector layer and a plurality of semiconductor layers. A passivation layer is arranged between the metal reflector layer and first and second electrical contacts, wherein the first electrical contact is arranged in conductive electrical communication with a first semiconductor layer, and the second electrical contact is arranged in conductive electrical communication with a second semiconductor layer. For single or multi-layer mirrors including surfaces exhibiting less than 100% reflectivity, some light may be absorbed by the mirror. Additionally, light that is redirected through the active LED structure may be absorbed by other layers or elements within the LED chip.

As used herein, a layer or region of a light-emitting device may be considered to be "transparent" when at least 80% of emitted radiation that impinges on the layer or region emerges through the layer or region. Moreover, as used herein, a layer or region of an LED is considered to be "reflective" or embody a "mirror" or a "reflector" when at least 80% of the emitted radiation that impinges on the layer or region is reflected. In some embodiments, the emitted radiation comprises visible light such as blue and/or green LEDs with or without lumiphoric materials. In other embodiments, the emitted radiation may comprise nonvisible light. For example, in the context of GaN-based blue and/or green LEDs, silver (Ag) may be considered a reflective material (e.g., at least 80% reflective). In the case of ultraviolet (UV) LEDs, appropriate materials may be selected to provide a desired, and in some embodiments high, reflectivity and/or a desired, and in some embodiments low, absorption. In certain embodiments, a "light-transmissive" material may be configured to transmit at least 50% of emitted radiation of a desired wavelength.

The present disclosure can be useful for LED chips having a variety of geometries, such as vertical geometry or lateral geometry. A vertical geometry LED chip typically includes anode and cathode connections on opposing sides or faces of the LED chip. A lateral geometry LED chip typically includes both anode and cathode connections on the same side of the LED chip that is opposite a substrate, such as a growth substrate. In some embodiments, a lateral geometry LED chip may be mounted on a submount of an LED package such that the anode and cathode connections are on a face of the LED chip that is opposite the submount. In this configuration, wirebonds may be used to provide electrical connections with the anode and cathode connections. In other embodiments, a lateral geometry LED chip may be flip-chip mounted on a surface of a submount of an LED package such that the anode and cathode connections are on a face of the active LED structure that is adjacent to the submount. In this configuration, electrical traces or patterns may be provided on the submount for providing electrical connections to the anode and cathode connections of the LED chip. In a flip-chip configuration, the active LED structure is configured between the substrate of the LED chip and the submount for the LED package. Accordingly, light emitted from the active LED structure may pass through the substrate in a desired emission direction. In some embodiments, the flip-chip LED chip may be configured as described in commonly-assigned U.S. Publication No. 2017/0098746, which is hereby incorporated by reference herein. In some embodiments, an LED package may be configured as set forth in the following commonly-assigned U.S. patents, which are hereby incorporated by reference herein: U.S. Pat. Nos. 8,866,169; 9,070,850; 9,887,327; and 10,468,565.

FIG. 1 is a cross-sectional view of a representative LED chip 10 arranged in a flip-chip configuration, although other configurations are possible. The LED chip 10 includes an active structure 12 comprising a p-type layer 14, an n-type layer 16, and an active layer 18 formed on a substrate 20. In some embodiments, the n-type layer 16 is between the active layer 18 and the substrate 20. In other embodiments, the doping order may be reversed such that a layer 16 is doped p-type and a layer 14 is doped n-type. The substrate 20 can comprise many different materials such as SiC or sapphire and can have one or more surfaces that are shaped, textured, or patterned to enhance light extraction. In certain embodiments, the substrate 20 is light transmissive (preferably transparent) and may include a patterned surface 24 that is proximate the active LED structure 12 and includes multiple recessed and/or raised features. In some embodiments, the patterned surface 24 is adjacent the n-type layer 16 of the active LED structure 12. The patterned surface 24 is particularly useful in embodiments in which the substrate 20 comprises sapphire in order to promote extraction of light through an interface between the active LED structure 12 and the substrate 20.

In FIG. 1, a first reflective layer 26 is provided on the p-type layer 14. In certain embodiments, a current spreading layer (not shown) may be provided between the p-type layer 14 and the first reflective layer 26. The current spreading layer may include a thin layer of a transparent conductive oxide such indium tin oxide (ITO) or a metal such as platinum (Pt), although other materials may be used. The first reflective layer 26 can comprise many different materials and preferably comprises a material that presents an index of refraction step with the material comprising the active LED structure 12 to promote total internal reflection (TIR) of light generated from the active LED structure 12. Light that experiences TIR is redirected without experiencing absorption or loss, and can thereby contribute to useful or desired LED chip emission. In some embodiments, the first reflective layer 26 comprises a material with an index of refraction lower than the index of refraction of the active LED structure 12 material. The first reflective layer 26 may comprise many different materials, with some having an index of refraction less than 2.3, while others can have an index of refraction less than 2.15, less than 2.0, and less than 1.5. In some embodiments the first reflective layer 26 comprises a dielectric material, with some embodiments comprising silicon dioxide ($SiO_2$) and/or silicon nitride (SiN). It is understood that many dielectric materials can be used such as SiN, SiNx, $Si_3N_4$, Si, germanium (Ge), $SiO_2$, SiOx, titanium dioxide ($TiO_2$), tantalum pentoxide ($Ta_2O_5$), ITO, magnesium oxide (MgOx), zinc oxide (ZnO), and combinations thereof. In certain embodiments, the first reflective layer 26 may include multiple alternating layers of different dielectric materials, e.g. alternating layers of $SiO_2$ and SiN that symmetrically repeat or are asymmetrically arranged. Some Group III nitride materials such as GaN can have an index of refraction of approximately 2.4, and $SiO_2$ can have an index of refraction of approximately 1.48, and SiN can have an index of refraction of approximately 1.9. Embodiments with an active LED structure 12 comprising GaN and the first reflective layer 26 that comprises $SiO_2$ can have a sufficient index of refraction step between the two to allow for efficient TIR of light. The first reflective layer 26 can have different thicknesses depending on the type of materials used, with some embodiments having a thickness of at least 0.2 microns (μm). In some of these embodiments, the first reflective layer 26 can have a thickness in the range of 0.2 μm to 0.7 μm, while in some of these embodiments it can be approximately 0.5 μm thick.

In FIG. 1, the LED chip 10 may further include a second reflective layer 28 that is on the first reflective layer 26 such that the first reflective layer 26 is arranged between the active LED structure 12 and the second reflective layer 28. The second reflective layer 28 may include a metal layer that is configured to reflect any light from the active LED structure 12 that may pass through the first reflective layer 26. The second reflective layer 28 can comprise many different materials such as Ag, gold (Au), Al, or combinations thereof. As illustrated, the second reflective layer 28 may include one or more reflective layer interconnects 30 that provide an electrically conductive path through the first reflective layer 26. In certain embodiments, the reflective layer interconnects 30 comprise reflective layer vias. Accordingly, the first reflective layer 26, the second reflective layer 28, and the reflective layer interconnects 30 form a reflective structure of the LED chip 10. In some embodiments, the reflective layer interconnects 30 comprise the same material as the second reflective layer 28 and are formed at the same time as the second reflective layer 28. In other embodiments, the reflective layer interconnects 30 may comprise a different material than the second reflective layer 28. The LED chip 10 may also comprise a barrier layer 32 on the second reflective layer 28 to prevent migration of the second reflective layer 28 material, such as Ag, to other layers. Preventing this migration helps the LED chip 10 maintain efficient operation through its lifetime. The barrier layer 32 may comprise an electrically conductive material, with suitable materials including but not limited to sputtered Ti/Pt followed by evaporated Au bulk material or sputtered Ti/Ni followed by an evaporated Ti/Au bulk material. A passivation layer 34 is included on the barrier layer 32 as well as any portions of the second reflective layer 28 that may be uncovered by the barrier layer 32. The passivation layer 34 protects and provides electrical insulation for the LED chip 10 and can comprise many different materials, such as a dielectric material. In some embodiments, the passivation layer 34 is a single layer, and in other embodiments, the passivation layer 34 comprises a plurality of layers. A suitable material for the passivation layer 34 includes but is not limited to silicon nitride. In some embodiments, the passivation layer 34 includes a metal-containing interlayer 36 arranged therein, wherein the interlayer 36 may comprise Al or another suitable metal. Notably, the interlayer 36 is embedded within the passivation layer 34 and is electrically isolated from the rest of the LED chip 10. In application, the interlayer 36 may function as a crack stop layer for any cracks that may propagate through the passivation layer 34. Additionally, the interlayer 36 may reflect at least some light that may pass through both the first reflective layer 26 and the second reflective layer 28.

In FIG. 1, the LED chip 10 comprises a p-contact 38 and an n-contact 40 that are arranged on the passivation layer 34 and are configured to provide electrical connections with the active LED structure 12. The p-contact 38, which may also be referred to as an anode contact, may comprise one or more p-contact interconnects 42 that extend through the passivation layer 34 to the barrier layer 32 or the second reflective layer 28 to provide an electrical path to the p-type layer 14. In certain embodiments, the one or more p-contact interconnects 42 comprise one or more p-contact vias. The n-contact 40, which may also be referred to as a cathode contact, may comprise one or more n-contact interconnects 44 that extend through the passivation layer 34, the barrier layer 32, the first and second reflective layers 28, 32, the p-type layer 14, and the active layer 18 to provide an electrical path to the n-type layer 16. In certain embodiments, the one or more n-contact interconnects 44 comprise one or more n-contact vias. In operation, a signal applied across the p-contact 38 and the n-contact 40 is conducted to the p-type layer 14 and the n-type layer 16, causing the LED chip 10 to emit light from the active layer 18. The p-contact 38 and the n-contact 40 can comprise many different materials such as Au, copper (Cu), nickel (Ni), In, Al, Ag, tin (Sn), Pt, or combinations thereof. In still other embodiments, the p-contact 38 and the n-contact 40 can comprise conducting oxides and transparent conducting oxides such as ITO, nickel oxide (NiO), ZnO, cadmium tin oxide, indium oxide, tin oxide, magnesium oxide, $ZnGa_2O_4$, $ZnO_2/Sb$, $Ga_2O_3/Sn$, $AgInO_2/Sn$, $In_2O_3/Zn$, $CuAlO_2$, LaCuOS, $CuGaO_2$, and $SrCu_2O_2$. The choice of material used can depend on the location of the contacts and on the desired electrical characteristics, such as transparency, junction resistivity, and sheet resistance. As described above, the LED chip 10 is arranged for flip-chip mounting and the p-contact 38 and n-contact 40 are configured to be mounted or bonded to a surface, such as a printed circuit board. In this regard, the LED chip 10 includes a mounting face 46 that is configured to be mounted to a surface, and a primary light-emitting face 48 that is opposite the mounting face 46. In certain embodiments, the primary light-emitting face 48 comprises the substrate 20, and light emitted from the active layer 18 primarily exits the LED chip 10 through the substrate 20. In other embodiments, the substrate 20 may be removed or replaced.

Figure 2:
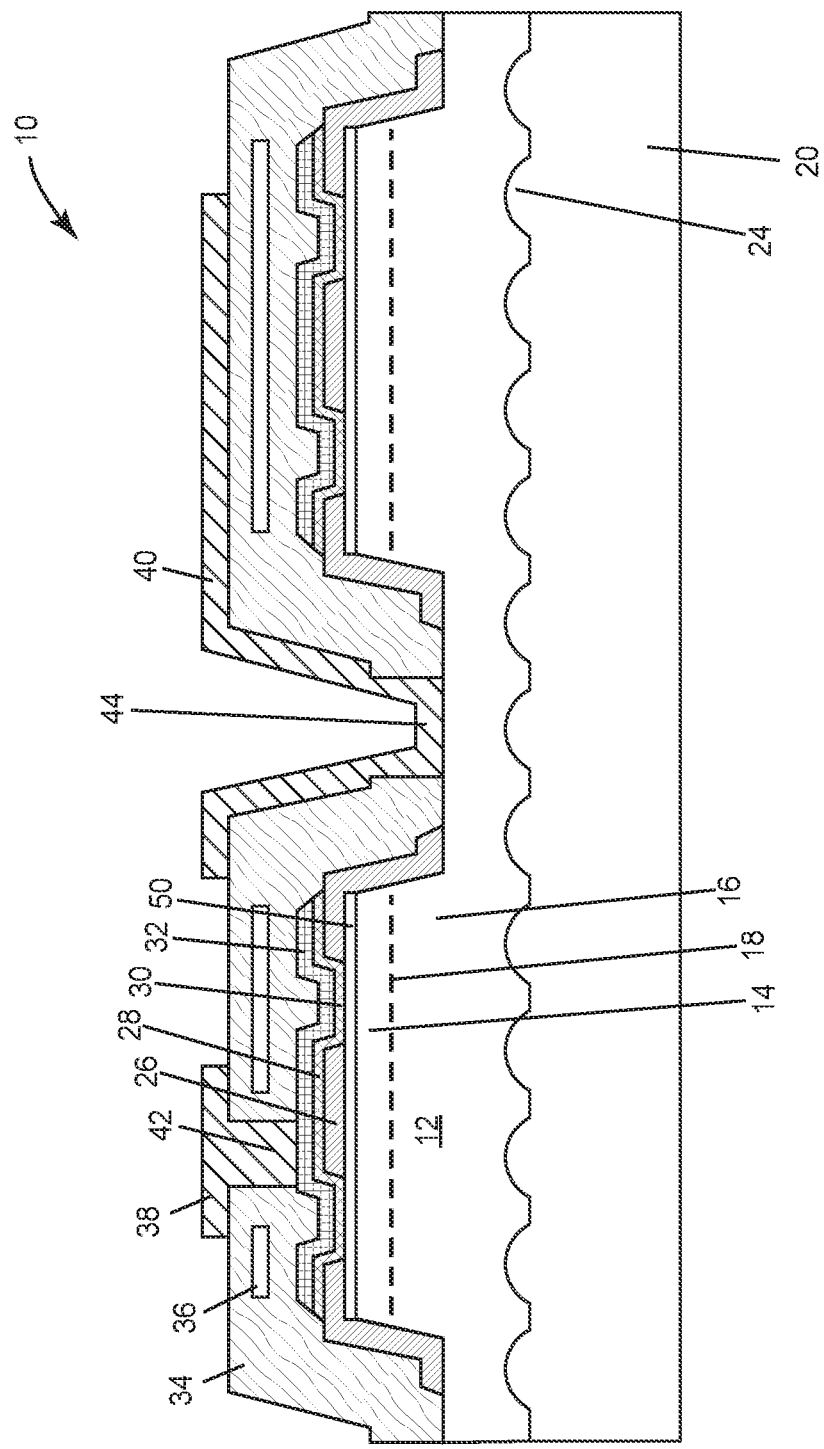
FIG. 2 is cross-sectional view of a portion of the LED chip of FIG. 1 before flip-chip mounting.

FIG. 2 is cross-sectional view of a portion of the LED chip 10 of FIG. 1 before flip-chip mounting and includes the active LED structure 12, the p-type layer 14, the n-type layer 16, the active layer 18, the substrate 20, the patterned surface 24, the first reflective layer 26, the second reflective layer 28, the one or more reflective layer interconnects 30, the barrier layer 32, the passivation layer 34, and the interlayer 36 as previously described. A current spreading layer 50 as previously described is visible in FIG. 2. As shown, the p-contact 38, the p-contact interconnect 42, the n-contact 40, and the n-contact interconnect 44 extend through the passivation layer 34. Notably, the n-contact interconnect 44 extends through a larger opening in the passivation layer 34 than an opening in the passivation layer 34 through which the p-contact interconnect 42 extends. The n-contact interconnect 44 additionally extends through an opening in the active LED structure 12 including the p-type layer 14, the active region 18, and a portion of the n-type layer 16. In this regard, the n-type interconnect 44 is relatively larger than the p-type interconnect 42 and the reflective layer interconnects 30. In certain embodiments, a portion of the first reflective layer 26 may be arranged along a sidewall of the opening in the active LED structure 12 where the n-type interconnect 44 is formed. In this regard, at least some light generated from the active LED structure 12 that travels in a direction toward the n-type interconnect 44 may be redirected without being lost to absorption in the n-type interconnect 44. Additionally, a portion of the first reflective layer 26 may also be arranged to laterally or peripherally bound the p-type layer 14, the active region 18, and portions of the n-type layer 16 around a perimeter of the LED chip 10 to redirect light that may otherwise laterally escape along outside edges of the LED chip 10.

Figure 3A:
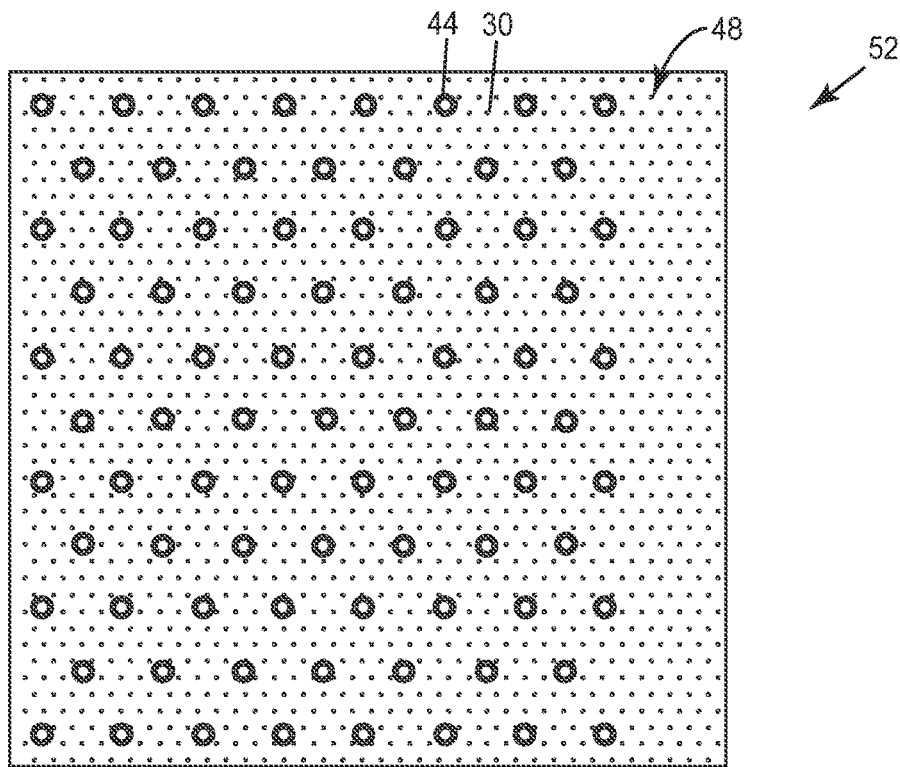
FIG. 3A is a top view of a primary light-emitting face of a representative LED chip that includes a plurality of n-contact interconnects and a plurality of reflective layer interconnects.

FIG. 3A is a top view of the primary light-emitting face 48 of a representative LED chip 52 that includes a plurality of n-contact interconnects 44 and a plurality of reflective layer interconnects 30. As illustrated, the n-contact interconnects 44 are larger in size and more prominent than the reflective layer interconnects 30. The n-contact interconnects 44 appear as an array of circles across the LED chip 52, and the reflective layer interconnects 30 appear as an array of smaller circles across the LED chip 52. As previously described, the n-type interconnects 44 are part of electrically conductive paths to the n-type layer 16 (FIG. 2) and the reflective layer interconnects 30 are part of electrically conductive paths to the p-type layer 14 (FIG. 2). In this regard, the plurality of n-contact interconnects 44 and the plurality of reflective layer interconnects 30 are configured to spread current across the LED chip 52. The n-contact interconnects 44 create dark regions in the LED chip 52 that generally correspond to areas where the p-type layer 14 (FIG. 2) and the active layer 18 (FIG. 2) have been removed. In this regard, the n-type interconnects 44 comprise regions of the LED chip 52 that do not emit light and may additionally absorb some light from other regions of the LED chip 52. Accordingly, the n-contact interconnects 44 are typically configured to be just large enough to provide adequate electrical connections without being too large to reduce the impact on overall brightness. The plurality of n-contact interconnects 44 are arranged to be evenly spaced from one another in a first pattern or array across the LED chip 52. In a similar manner, the plurality of reflective layer interconnects 30 are arranged to be evenly spaced from one another in a second pattern or array across an area of the LED chip 52. In areas where the second pattern of reflective layer interconnects 30 overlaps with the first pattern of n-contact interconnects 44, then only a particular n-contact interconnect 44 is present.

Figure 3B:
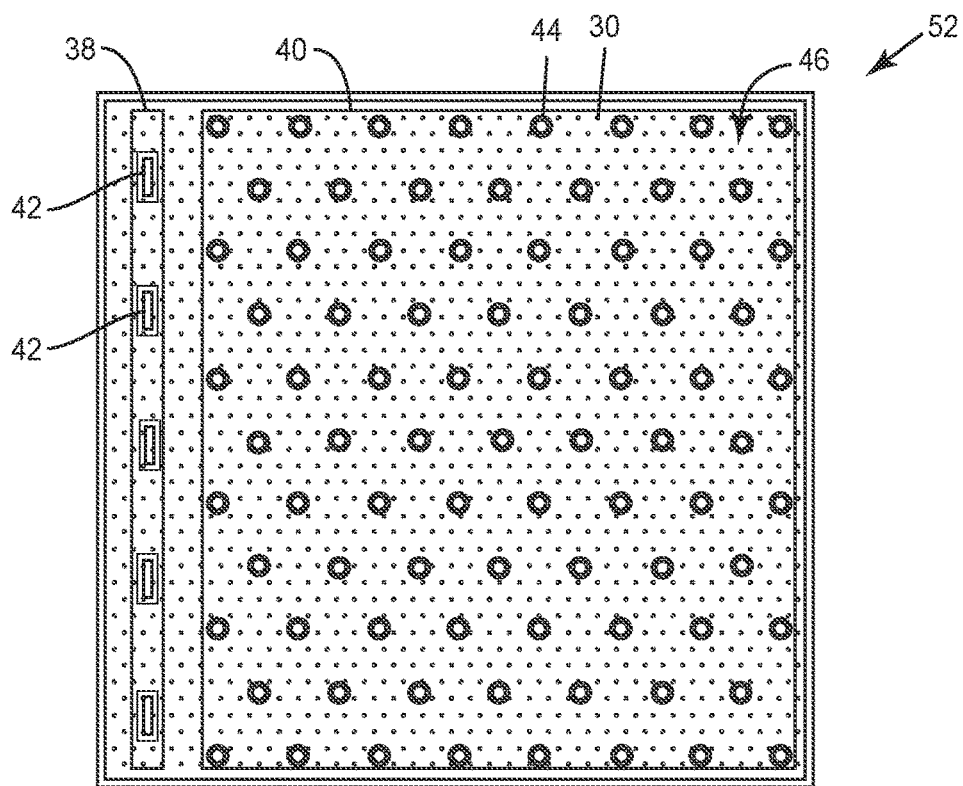
FIG. 3B is a bottom view of the mounting face of the LED chip of FIG. 3A.

FIG. 3B is a bottom view of the mounting face 46 of the LED chip 52 of FIG. 3A. As illustrated, the n-contact interconnects 44 and the reflective layer interconnects 30 are all visible from the mounting face 46. The p-contact 38 and the n-contact 40 as previously described are also visible from the mounting face 46. As illustrated, the p-contact 38 is formed in the shape of a narrow rectangle and includes several p-contact interconnects 42, and the n-contact 40 is formed in the shape of a wider rectangle on the mounting face 46. The mounting face 46 of the LED chip 52 is configured to be mounted to another surface, including a reflective surface, a heat sink, another substrate, a printed circuit board, and a housing of lighting device, among others.

Figure 4A:
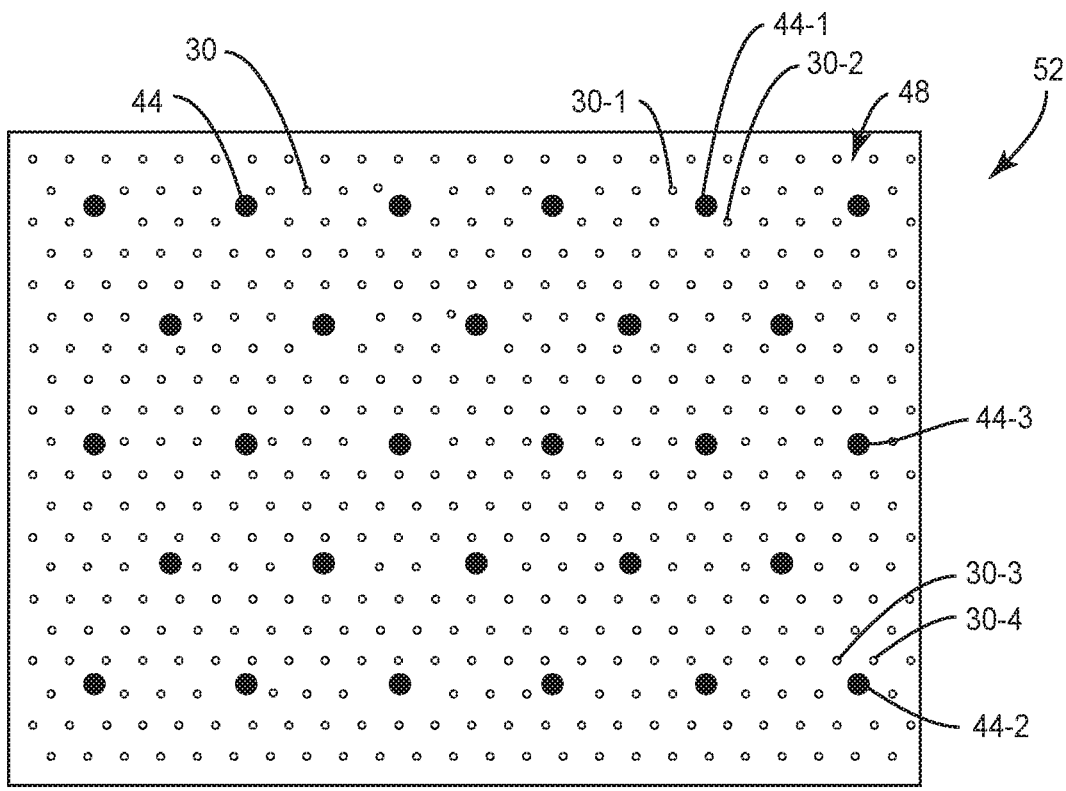
FIG. 4A is a partial top view illustration of a portion of the primary light-emitting face of the LED chip of FIG. 3A.

FIG. 4A is a partial top view illustration of a portion of the primary light-emitting face 48 of the LED chip 52 of FIG. 3A. In FIG. 4A, the plurality of n-contact interconnects 44 are illustrated with solid shading for illustrative purposes. As previously described, the n-contact interconnects 44 are spaced evenly from one another to form the first pattern or array of n-contact interconnects 44, and the reflective layer interconnects 30 are spaced evenly from one another to form the second pattern or array of reflective layer interconnects 30 across the LED chip 52. As the n-contact interconnects 44 and the reflective layer interconnects 30 are arranged to connect different portions of the LED chip 52 as previously described, their respective patterns are formed independently from each other. For example, reflective layer interconnects 30-1, 30-2 that are closest to a first n-contact interconnect 44-1 are arranged in different configurations than reflective layer interconnects 30-3, 30-4 that are closest to a second n-contact interconnect 44-2. By way of another example, a third n-contact interconnect 44-3 may happen to be more centrally located with respect to adjacent reflective layer interconnects 30. In this regard, the first pattern of n-contact interconnects 44 is not symmetric with the second pattern of reflective layer interconnects 30 and accordingly, the first pattern of n-contact interconnects 44 and the second pattern of reflective layer interconnects 30 collectively form an asymmetric pattern across the LED chip 52. When the spacing between individual n-contact interconnects 44 and adjacent reflective layer interconnects 30 is variable, current spreading in the LED chip 52 may be non-uniform. In particular, in regions where the reflective layer interconnects 30 are arranged too close to an individual n-contact interconnect 44, localized areas with current crowding may occur. Conversely, in regions where the reflective layer interconnects 30 are arranged too far away from an individual n-contact interconnect 44, localized areas with insufficient current spreading may occur.

Figure 4B:
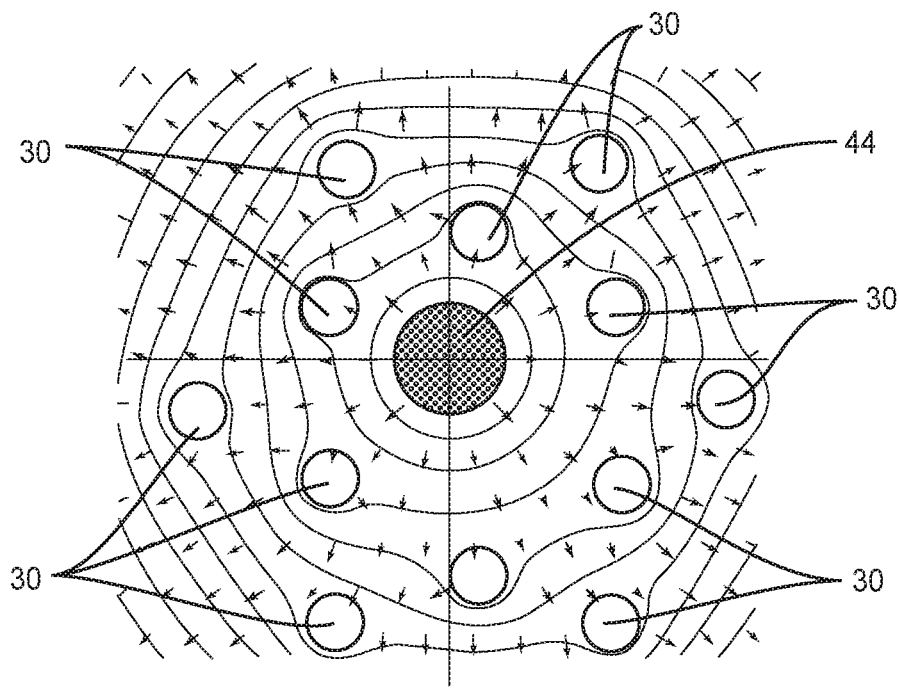
FIG. 4B is a model of electrostatic fields using finite element method (FEM) modeling when n-contact interconnects and reflective layer interconnects are arranged in non-symmetric patterns in a manner similar to FIG. 4A.

FIG. 4B is a model of electrostatic fields using finite element method (FEM) modeling when n-contact interconnects and reflective layer interconnects are arranged in non-symmetric patterns in a manner similar to FIG. 4A. In the image of FIG. 4B, an n-contact interconnect 44 is surrounded by a plurality of reflective layer interconnects 30 arranged with different lateral spacings from the n-contact interconnect 44. Scaler field lines are illustrated concentrically outward from the n-contact interconnect 44 and each line represents areas with about equal electric potentials. The electric potential progressively changes from higher values to lower values the farther the scaler field lines are from the n-contact interconnect 44. The arrows in FIG. 4B represent vectors for the electric field. The size and shape of the arrows represent size, shape, and direction of localized electric fields. As illustrated, the non-symmetric spacing of the reflective layer interconnects 30 relative to the n-contact interconnect 44 forms variable scaler field lines that result in localized areas of concentrated electric fields, particularly in areas where certain reflective layer interconnects 30 are arranged closest to the n-contact interconnect 44.

According to embodiments disclosed herein, LED chips are disclosed with improved current spreading, which may also provide improved brightness and efficiency. In certain embodiments, a representative LED chip includes a plurality of first interconnects that are electrically connected to an n-type layer and a plurality of second interconnects that are electrically connected to a p-type layer. The plurality of first interconnects and the plurality of second interconnects may be collectively arranged to form a common and symmetric pattern across the LED chip. In certain embodiments, the first and second interconnects may collectively form an array of interconnects that are spaced in equal distances relative to one another across the LED chip to reduce localized areas of current crowding. In certain embodiments, the plurality of first interconnects may comprise n-contact interconnects and the plurality of second interconnects may comprise reflective layer interconnects as previously described.

Figure 5A:
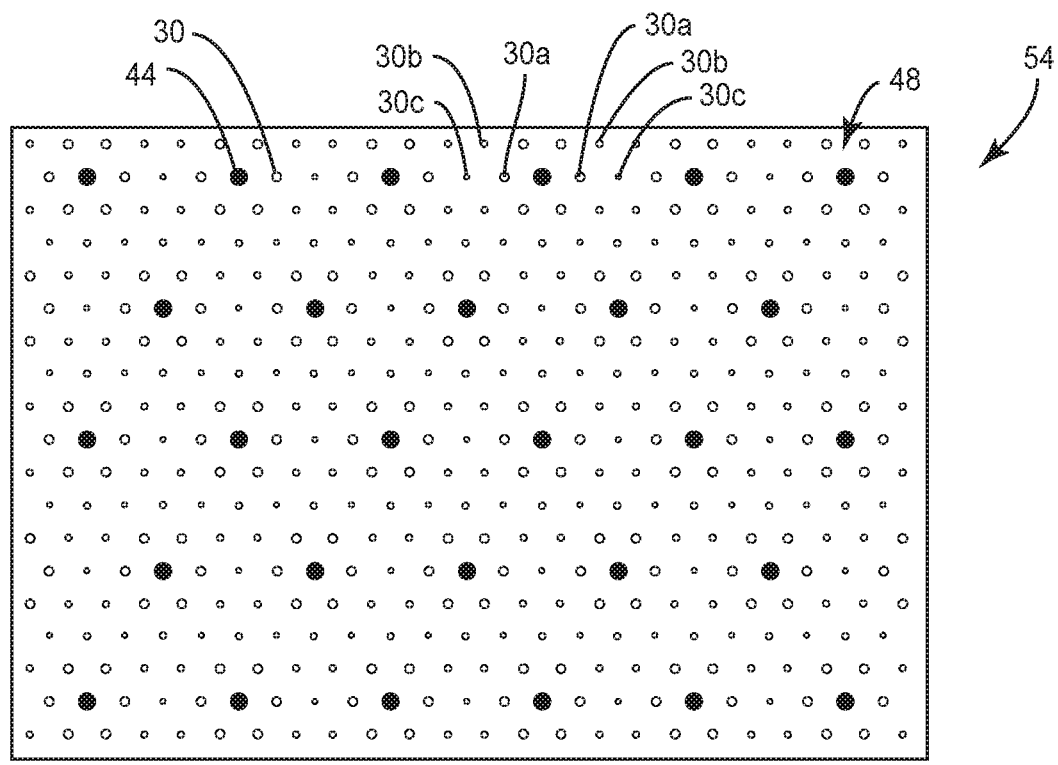
FIG. 5A is a partial top view illustration of a portion of the primary light-emitting face of an LED chip that includes symmetrically arranged interconnects.

FIG. 5A is a partial top view illustration of a portion of the primary light-emitting face 48 of an LED chip 54 that includes symmetrically arranged interconnects. The LED chip 54 includes the plurality of n-contact interconnects 44 and the plurality of reflective layer interconnects 30 as previously described. The n-contact interconnects 44 form a first pattern of n-contact interconnects 44, and the reflective layer interconnects 30 form a second pattern of reflective layer interconnects 30 across an area of the LED chip 54. As shown in FIG. 5A, the first pattern of n-contact interconnects 44 and the second pattern of reflective layer interconnects 30 collectively form a symmetric pattern across the LED chip 54. In certain embodiments, the first pattern of n-contact interconnects 44 is different than the second pattern of reflective layer interconnects 30. In FIG. 5A, the first pattern comprises a larger spacing between n-contact interconnects 44 than spacing between reflective layer interconnects 30 of the second pattern. In particular, each n-contact interconnect 44 is arranged in a location that is part of the second pattern of the reflective layer interconnects 30. In this manner, each n-contact interconnect 44 is spaced from any of the closest reflective layer interconnects 30 by a same distance that the reflective layer interconnects 30 are spaced from each other. In certain embodiments, a center point of each of the plurality of first interconnects 44 and a center point of each of the plurality of second interconnects 30 collectively form an array of equally spaced center points across the LED chip. In certain embodiments, a size or diameter of each reflective layer interconnect 30 may be different based on how closely spaced a particular reflective layer interconnect 30 is to a particular n-contact interconnect 44. In certain embodiments, the symmetric pattern illustrated in FIG. 5A may be arranged in a particular area of an LED chip, while an asymmetric pattern as illustrated in FIG. 4A is provided in a different area of the same LED chip.

As further illustrated in FIG. 5A, the plurality of reflective layer interconnects 30 include certain reflective layer interconnects 30*a*, 30*b*, 30*c* that each comprise different diameters. The reflective layer interconnects 30*a* are arranged closest to the n-contact interconnects 44 and have the largest diameters relative to the other reflective layer interconnects 30*b*, 30*c*. The reflective layer interconnects 30*c* are arranged farthest away from the n-contact interconnects 44 and have the smallest diameters relative to the other reflective layer interconnects 30*a*, 30*b*. Lastly, the reflective layer interconnects 30*b* are arranged with a distance away from the n-contact interconnects 44 and a diameter that are between those of the other reflective layer interconnects 30*a*, 30*c*. In this manner, a diameter of a reflective layer interconnect 30*a* that is arranged closest to a particular n-contact interconnect 44 is larger than a diameter of another individual reflective layer interconnect 30*b*, 30*c* that is arranged farther from the particular n-contact interconnect 44. As previously described, electric potential tends to be highest in areas that are closest to the n-contact interconnects 44 and the electric potential progressively decreases with distance away. In this regard, the reflective layer interconnects 30*a*, 30*b*, 30*c* are arranged with different diameters that increase and decrease in a manner that corresponds to the electric potential across the LED chip 54. In particular, the larger reflective layer interconnects 30*a* are arranged in areas to handle the highest electric fields for brightness gains. Additionally, arranging the smallest reflective layer interconnects 30*c* in areas with the smallest electric fields may also provide brightness gains because the smaller reflective layer interconnects 30*c* provide increased surface area for the reflective layer (26 in FIG. 2) in these areas. In other embodiments, all of the reflective layer interconnects 30*a*, 30*b*, 30*c* may have the same diameter. In still other embodiments, the reflective layer interconnects 30*a*, 30*b*, 30*c* may have diameters that vary in different configurations. For example, in certain embodiments, the reflective layer interconnects 30*a*, 30*b*, 30*c* may comprise diameters that progressively increase in size with increasing distance away from the n-contact interconnects 44. In this manner, a diameter of an individual reflective layer interconnect 30*a* that is arranged closest to a particular n-contact interconnect 44 is smaller than a diameter of another individual reflective layer interconnect 30*b*, 30*c* that is arranged farther from the particular n-contact interconnect 44. Additionally, diameters of the reflective layer interconnects 30*a*, 30*b*, 30*c* may be configured differently in different areas of the same LED chip 54 to tailor emission areas. For example, depending on the application, diameters of reflective layer interconnects 30 that are arranged near a perimeter of the LED chip 54 may be smaller or larger than diameters of other reflective layer interconnects 30 that are centrally located. In certain embodiments, the reflective layer interconnects 30 may comprise a certain diameter in a particular area of the LED chip 54, and a different diameter in a different area of the LED chip 54. In further embodiments, the reflective layer interconnects 30 may comprise a same diameter in a particular area of the LED chip 54, and a range of different diameters in a different area of the LED chip 54.

In certain embodiments, the reflective layer interconnects 30 comprise diameters that are constant or vary within in a range of about 2 µm to about 15 µm, or in a range of about 4 µm to about 10 µm. In certain embodiments, the n-contact interconnects 44 comprise diameters that are constant or vary within in a range of about 4 µm to about 25 µm, or in a range of about 5 µm to about 20 µm, or in a range of about 15 µm to about 25 µm.

Figure 5B:
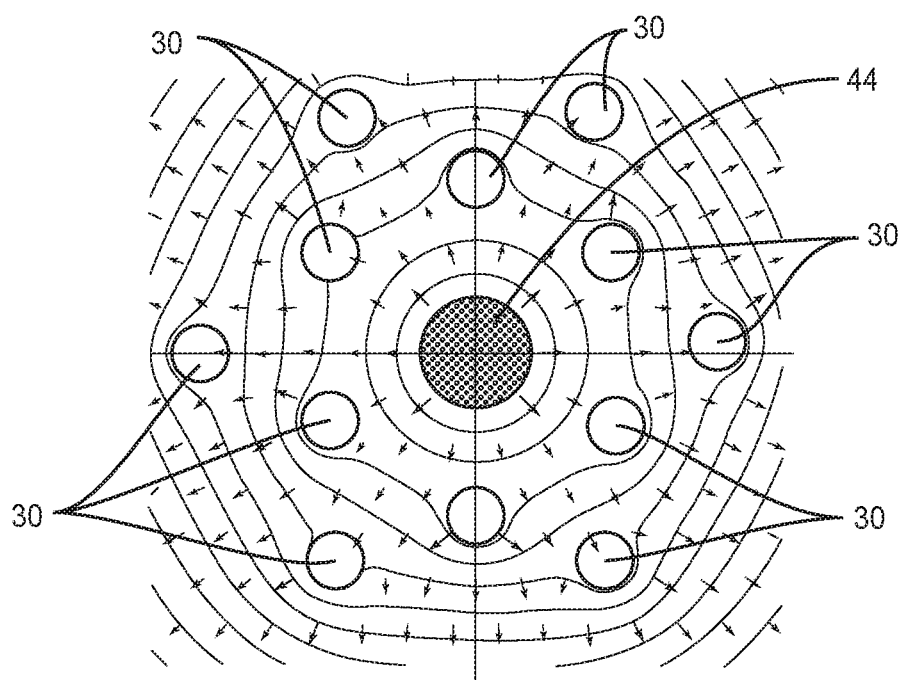
FIG. 5B is a model of electrostatic fields using FEM modeling when n-contact interconnects and reflective layer interconnects are arranged in a symmetric pattern in a manner similar to FIG. 5A.

FIG. 5B is a model of electrostatic fields using FEM modeling when n-contact interconnects and reflective layer interconnects are arranged in a symmetric pattern in a manner similar to FIG. 5A. In the image of FIG. 5B, the plurality of reflective layer interconnects 30 and the n-contact interconnect 44 collectively form a symmetric pattern. In particular, adjacent interconnects, regardless whether they are the n-contact interconnect 44 or any of the reflective layer interconnects 30, are arranged with equal spacing from one another. As shown, the scaler field lines and the electric field vector arrows are more evenly distributed than those of the non-symmetric pattern represented in FIG. 4B, thereby providing more evenly distributed current spreading.

Figure 6A:
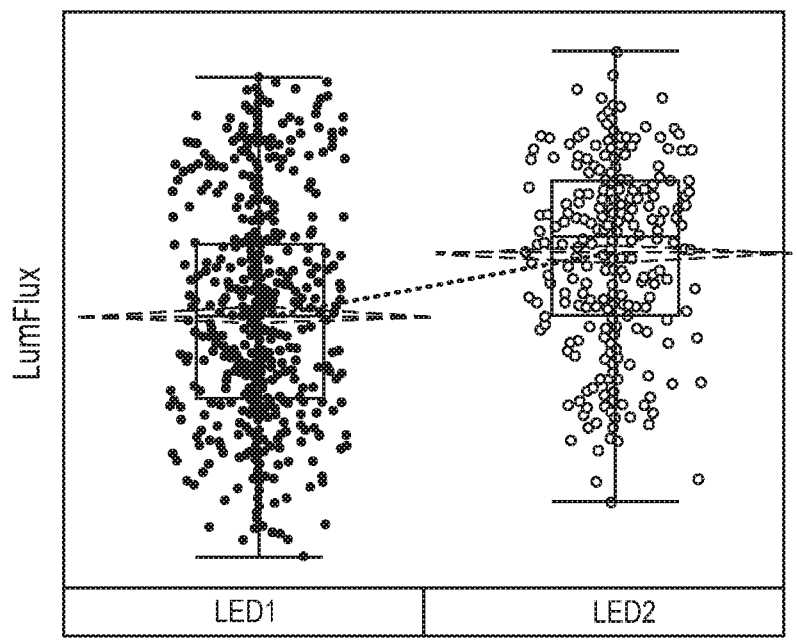
FIG. 6A is a comparison plot illustrating luminous flux measurements for a first set of LED chips that include interconnects arranged as illustrated in FIG. 4A and a second set of LED chips that include interconnects arranged as illustrated in FIG. 5A.
Figure 6B:
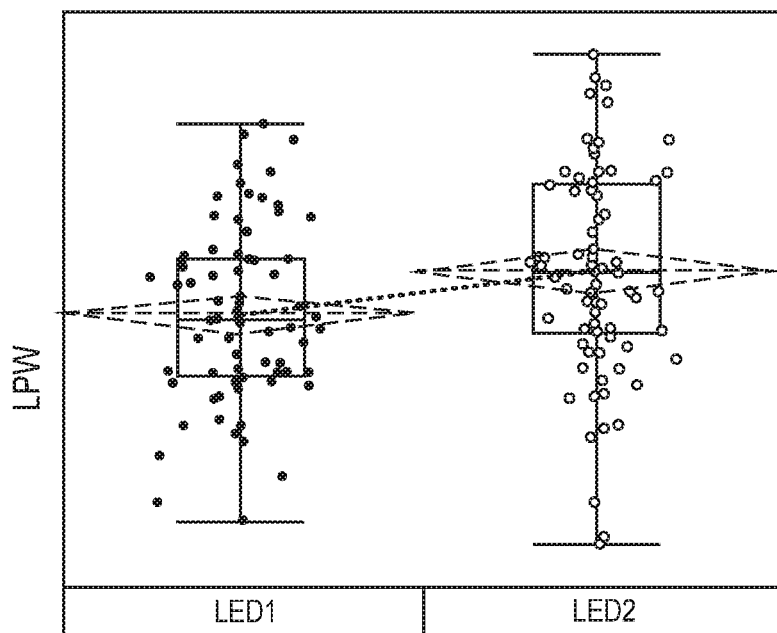
FIG. 6B is a comparison plot illustrating lumens per watt measurements for the same sets of LED chips represented in FIG. 6A.

According to aspects disclosed herein, improved or more evenly distributed current spreading in LED chips may also provide improved brightness and efficiency. In this regard, brightness and efficiency data were collected to compare LED chips with symmetric and non-symmetric arrangements of interconnects. FIG. 6A is a comparison plot illustrating luminous flux or brightness measurements for a first set of LED chips (LED1) that include interconnects arranged as illustrated in FIG. 4A and a second set of LED chips (LED2) that include interconnects arranged as illustrated in FIG. 5A. The y-axis represents luminous flux (LumFlux) in arbitrary units. As illustrated, the LED2 chips demonstrated noticeably higher average brightness measurements. In certain embodiments, the average increase in brightness between the LED2 chips and the LED1 chips was measured in a range between about one percent and two percent. FIG. 6B is a comparison plot illustrating efficiency or lumens per watt measurements for the same LED1 and LED2 chips represented in FIG. 6A. The y-axis represents lumens per watt (LPW) in arbitrary units. As illustrated, the LED2 chips are also noticeably more efficient than the LED1 chips, indicative of the increase in brightness shown in the comparison plot of FIG. 6A.

According to embodiments disclosed herein, LED chips may include a plurality of first interconnects and a plurality of second interconnects that are collectively arranged across the LED chip. In certain embodiments, diameters of the first interconnects, the second interconnects, or both of the first and second interconnects may vary or change depending on their locations within LED chips. Accordingly, current spreading, brightness uniformity, and other electrical properties may be tailored to various applications with different arrangements of the first and second interconnects. As previously described, the plurality of first interconnects may include n-contact interconnects and the plurality of second interconnects may include reflective layer interconnects.

Figure 7:
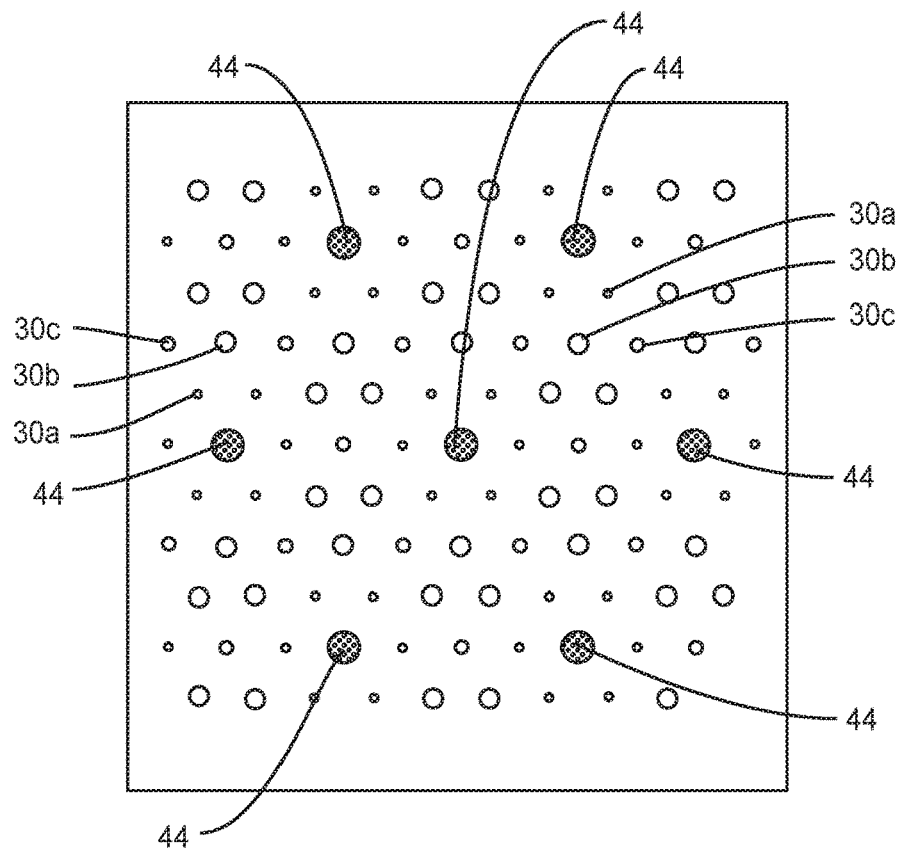
FIG. 7 is a model with reflective layer interconnects having different diameters that are arranged around n-contact interconnects to collectively form a symmetric pattern.

FIG. 7 is a model with reflective layer interconnects having different diameters that are arranged around n-contact interconnects to collectively form a symmetric pattern. In FIG. 7, the plurality of reflective layer interconnects 30*a*, 30*b*, 30*c* are arranged with distances progressively farther away from the n-contact interconnects 44. In certain embodiments, the reflective layer interconnects 30*a*, 30*b*, 30*c* and the n-contact interconnects 44 are arranged in a common symmetric pattern as previously described. As illustrated, the reflective layer interconnects 30*a* comprise the smallest diameters and are arranged closest to the n-contact interconnects 44, the reflective layer interconnects 30*b* comprise the largest diameters and are arranged farther away from the n-contact interconnects 44 than the reflective layer interconnects 30*a* are, and the reflective layer interconnects 30*c* comprise in between diameters and are configured farther away from the n-contact interconnects 44 than the reflective layer interconnects 30*b* are. Accordingly, reflective layer interconnects 30*a*, 30*b*, 30*c* may be arranged with diameters that progressively increase and then decrease with increasing distance away from the n-contact interconnects 44. By way of a non-limiting example, the n-contact interconnects 44 may comprise a diameter of about 20 µm, and the reflective layer interconnects 30a, 30b, 30c may comprise diameters of about 5 µm, 12 µm, and 8.5 µm, respectively.

Figure 8:
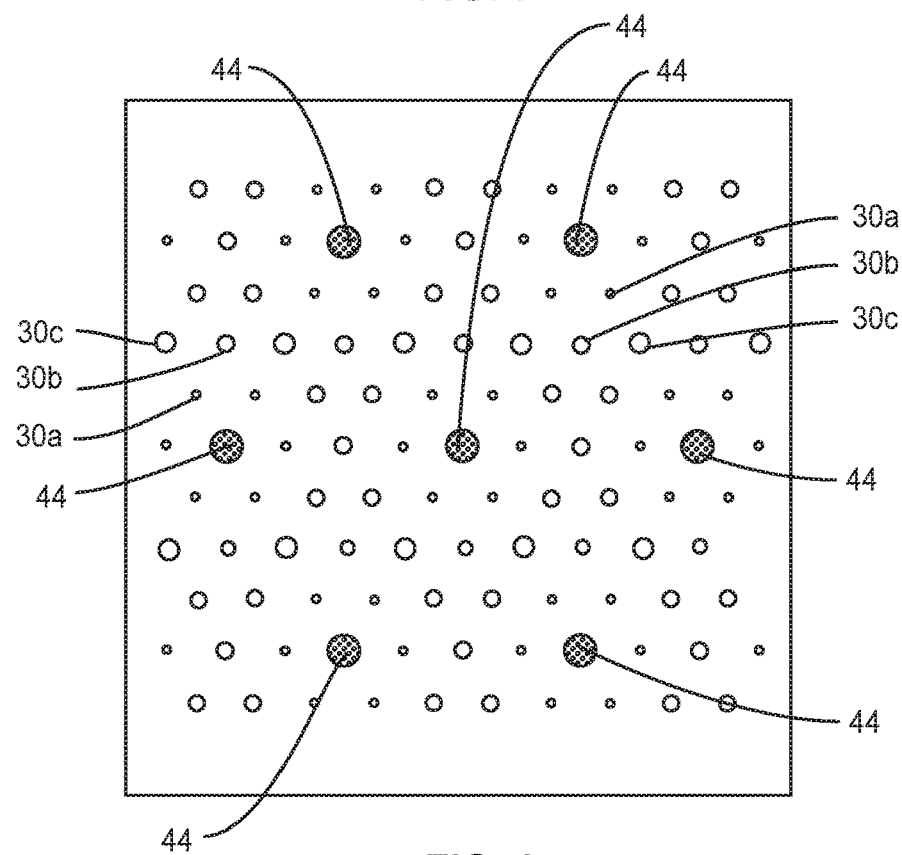
FIG. 8 is a model with reflective layer interconnects that are configured with diameters that progressively increase with increasing distance from n-contact interconnects and collectively form a symmetric pattern.

FIG. 8 is a model with reflective layer interconnects that are configured with diameters that progressively increase with increasing distance from n-contact interconnects and collectively form a symmetric pattern. In FIG. 8, the plurality of reflective layer interconnects 30a, 30b, 30c are arranged with distances progressively farther away from the n-contact interconnects 44 as previously described. In certain embodiments, the reflective layer interconnects 30a, 30b, 30c and the n-contact interconnects 44 are arranged in a common symmetric pattern as previously described. As illustrated, the reflective layer interconnects 30a comprise the smallest diameters and are arranged closest to the n-contact interconnects 44, the reflective layer interconnects 30b comprise larger diameters and are arranged farther away from the n-contact interconnects 44 than the reflective layer interconnects 30a are, and the reflective layer interconnects 30c comprise the largest diameters and are configured farther away from the n-contact interconnects 44 than the reflective layer interconnects 30b are. Accordingly, the reflective layer interconnects 30a, 30b, 30c may be arranged with diameters that progressively increase with increasing distance away from the n-contact interconnects 44. By way of a non-limiting example, the n-contact interconnects 44 may comprise a diameter of about 20 µm, and the reflective layer interconnects 30a, 30b, 30c may comprise diameters of about 5 µm, 8.5 µm, and 12 µm, respectively.

Figure 9:
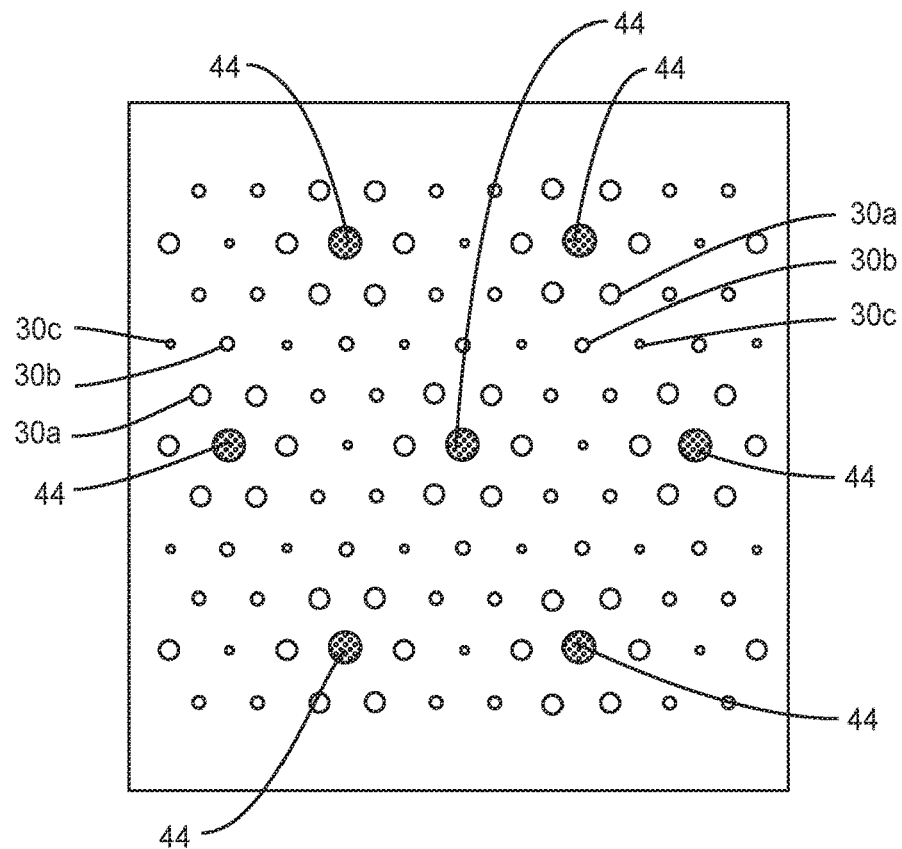
FIG. 9 is a model with reflective layer interconnects that are configured with diameters that progressively decrease with increasing distance from n-contact interconnects to collectively form a symmetric pattern.

FIG. 9 is a model with reflective layer interconnects that are configured with diameters that progressively decrease with increasing distance from n-contact interconnects to collectively form a symmetric pattern. In FIG. 9, the plurality of reflective layer interconnects 30a, 30b, 30c are arranged with distances progressively farther away from the n-contact interconnects 44 as previously described. In certain embodiments, the reflective layer interconnects 30a, 30b, 30c and the n-contact interconnects 44 are arranged in a common symmetric pattern as previously described. As illustrated, the reflective layer interconnects 30a comprise the largest diameters and are arranged closest to the n-contact interconnects 44, the reflective layer interconnects 30b comprise smaller diameters and are arranged farther away from the n-contact interconnects 44 than the reflective layer interconnects 30a are, and the reflective layer interconnects 30c comprise the smallest diameters and are configured farther away from the n-contact interconnects 44 than the reflective layer interconnects 30b are. Accordingly, the reflective layer interconnects 30a, 30b, 30c may be arranged with diameters that progressively decrease with increasing distance away from the n-contact interconnects 44. By way of a non-limiting example, the n-contact interconnects 44 may comprise a diameter of about 20 µm, and the reflective layer interconnects 30a, 30b, 30c may comprise diameters of about 12 µm, 8.5 µm, and 5 µm, respectively. In other embodiments, the reflective layer interconnects 30a, 30b, 30c may comprise diameters of about 8 µm, 6 µm, and 4 µm, respectively.

Figure 10:
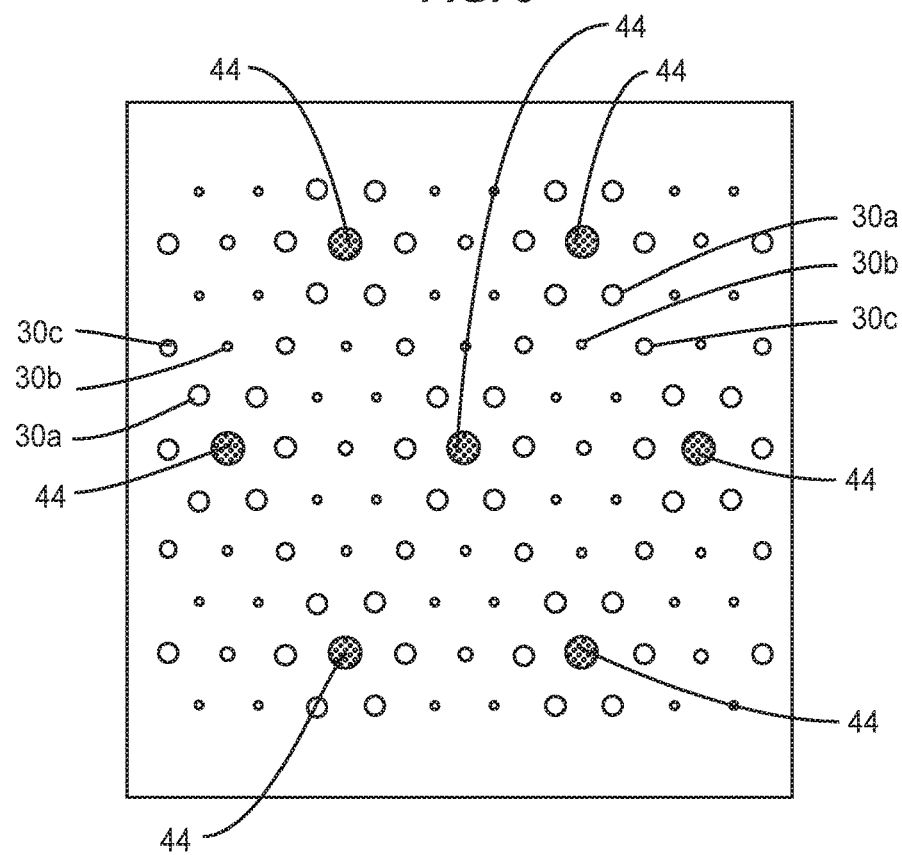
FIG. 10 is a model with reflective layer interconnects having different diameters are arranged around n-contact interconnects to collectively form a symmetric pattern.

FIG. 10 is a model with reflective layer interconnects having different diameters arranged around n-contact interconnects to collectively form a symmetric pattern. In FIG. 10, the plurality of reflective layer interconnects 30a, 30b, 30c are arranged with distances progressively farther away from the n-contact interconnects 44 as previously described.

In certain embodiments, the reflective layer interconnects 30a, 30b, 30c and the n-contact interconnects 44 are arranged in a common symmetric pattern as previously described. As illustrated, the reflective layer interconnects 30a comprise the largest diameters and are arranged closest to the n-contact interconnects 44, the reflective layer interconnects 30b comprise the smallest diameters and are arranged farther away from the n-contact interconnects 44 than the reflective layer interconnects 30a are, and the reflective layer interconnects 30c comprise in between diameters and are configured farther away from the n-contact interconnects 44 than the reflective layer interconnects 30b are. Accordingly, the reflective layer interconnects 30a, 30b, 30c may be arranged with diameters that progressively decrease and then increase with increasing distance away from the n-contact interconnects 44. By way of a non-limiting example, the n-contact interconnects 44 may comprise a diameter of about 20 µm, and the reflective layer interconnects 30a, 30b, 30c may comprise diameters of about 12 µm, 5 µm, and 8.5 µm, respectively.

Figure 11:
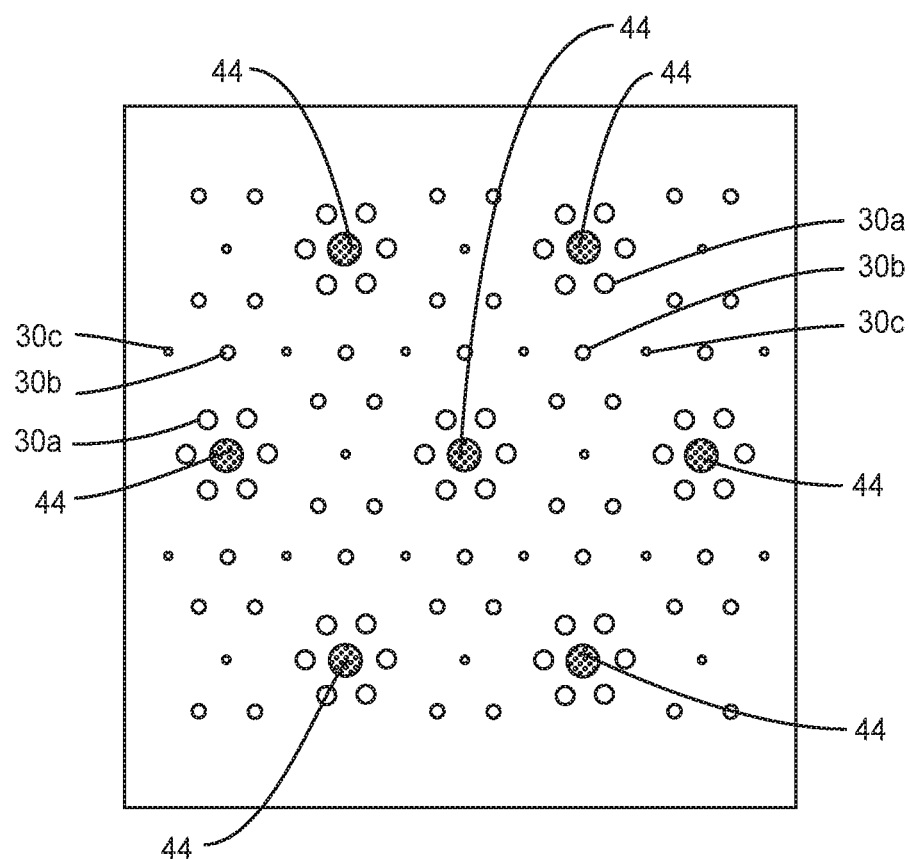
FIG. 11 is a model with reflective layer interconnects having different diameters and non-uniform distances from n-contact interconnects.

FIG. 11 is a model with reflective layer interconnects having different diameters and non-uniform distances from n-contact interconnects. In FIG. 11, the plurality of reflective layer interconnects 30a, 30b, 30c are arranged with distances progressively farther away from the n-contact interconnects 44 as previously described. In contrast to FIGS. 7-10, the reflective layer interconnects 30a, 30b, 30c are arranged with variable distances away from the n-contact interconnects 44. As illustrated, the reflective layer interconnects 30a comprise the largest diameters and are arranged closest to the n-contact interconnects 44, the reflective layer interconnects 30b comprise smaller diameters and are arranged farther away from the n-contact interconnects 44 than the reflective layer interconnects 30a are, and the reflective layer interconnects 30c comprise in between diameters and are configured farther away from the n-contact interconnects 44 than the reflective layer interconnects 30b are. Additionally, the spacing between adjacent reflective layer interconnects 30a, 30b, 30c is uneven or non-uniform. In particular, the spacing between the reflective layer interconnect 30a and the reflective layer interconnect 30b is larger than the spacing between the reflective layer interconnects 30b and 30c. In this regard, the reflective layer interconnects 30a with the largest diameters are positioned in areas with the highest electric potentials for improved brightness, and the other reflective layer interconnects 30b, 30c are positioned farther from the n-contact interconnects 44 to spread current densities farther away from the n-contact interconnects 44. In certain embodiments, this configuration may increase LED chip lifetimes while also providing improved brightness. In this manner, LED chips as disclosed herein may include spacings between adjacent reflective layer interconnects 30a, 30b, 30c that are different based on a relative position of each reflective layer interconnect 30a, 30b, 30c to the n-contact interconnect 44. In certain embodiments, the reflective layer interconnects 30a, 30b, 30c and the n-contact interconnects 44 may collectively form a pattern that is symmetric or asymmetric.

Figure 12:
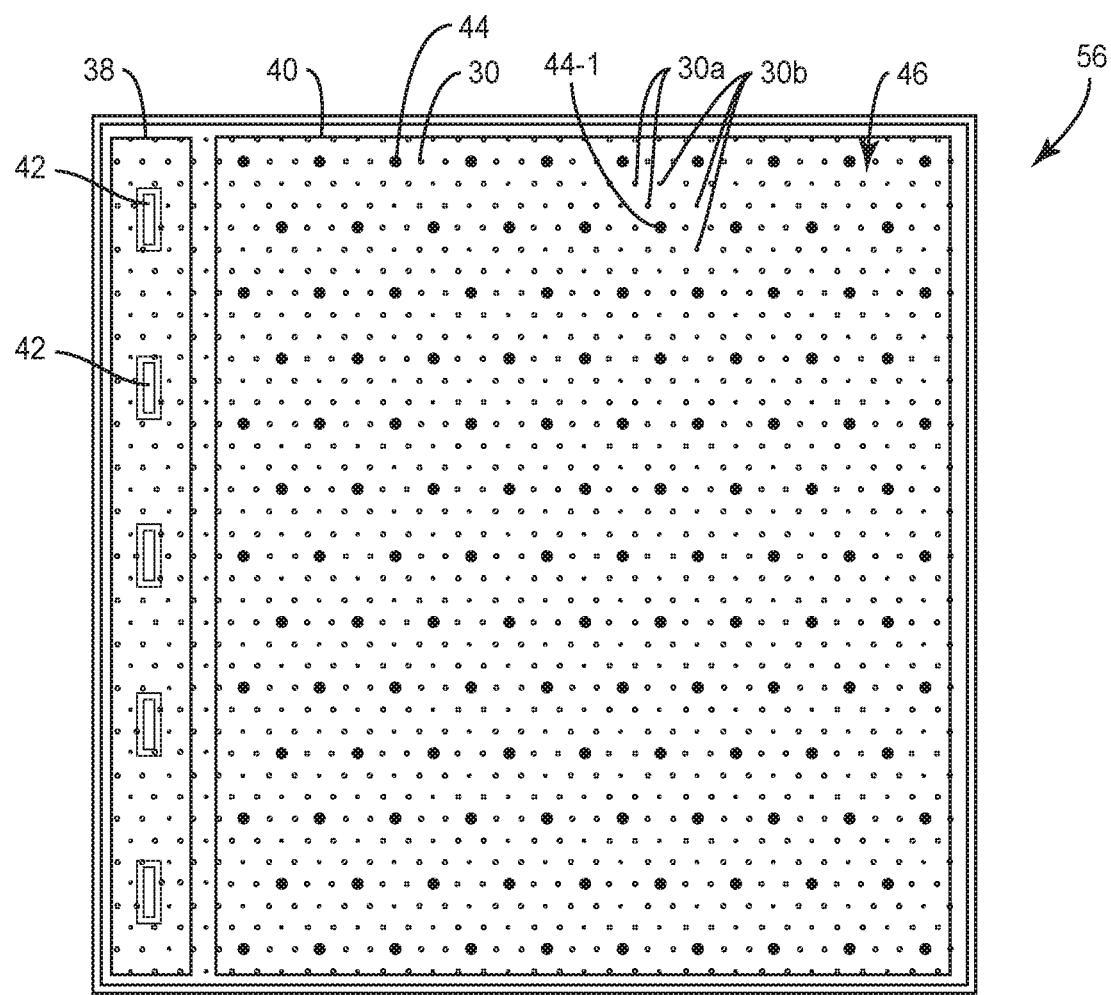
FIG. 12 is a bottom view of the mounting face of an LED chip that includes n-contact interconnects and reflective layer interconnects that form a symmetric pattern.

FIG. 12 is a bottom view of the mounting face 46 of an LED chip 56 that includes n-contact interconnects 44 and reflective layer interconnects 30 that form a symmetric pattern. As illustrated, the n-contact interconnects 44 and the reflective layer interconnects 30 are all visible from the mounting face 46. The p-contact 38 and the n-contact 40 as previously described are also visible from the mounting face 46. As illustrated, the p-contact 38 is formed in the shape of a narrow rectangle and includes several p-contact interconnects 42, and the n-contact 40 is formed in the shape of a wider rectangle on the mounting face 46. The mounting face 46 of the LED chip 52 is configured to be mounted to another surface, including a reflective surface, a heat sink, another substrate, a printed circuit board, and a housing of a lighting device, among others. The symmetric pattern of the n-contact interconnects 44 and the reflective layer interconnects 30 illustrated in FIG. 12 is arranged in an alternative configuration. Notably, fewer reflective layer interconnects 30 are arranged between the n-contact interconnects 44. For example, in FIG. 12, a linear line between the center points of adjacent n-contact interconnects 44 will intersect only two reflective layer interconnects 30, where in previously described embodiments, a similar linear line would intersect with three reflective layer interconnects 30. Different numbers of reflective layer interconnects 30 allow different patterns that may be tailored for a particular application. In certain embodiments, diameters of the reflective layer interconnects 30a that are configured closest to the n-contact interconnects 44 are larger than diameters of the reflective layer interconnects 30b that are spaced farther away from n-contact interconnects 44. In the pattern illustrated in FIG. 12, the space between an individual n-contact interconnect 44-1 and all adjacent n-contact interconnects 44 is populated with twice as many of the reflective layer interconnects 30a (twelve total) as the reflective layer interconnects 30b (six total). In certain embodiments, the relative diameters may be reversed such that the reflective layer interconnects 30b have the largest diameter and the reflective layer interconnects 30a have the smallest diameter.

Figure 13A:
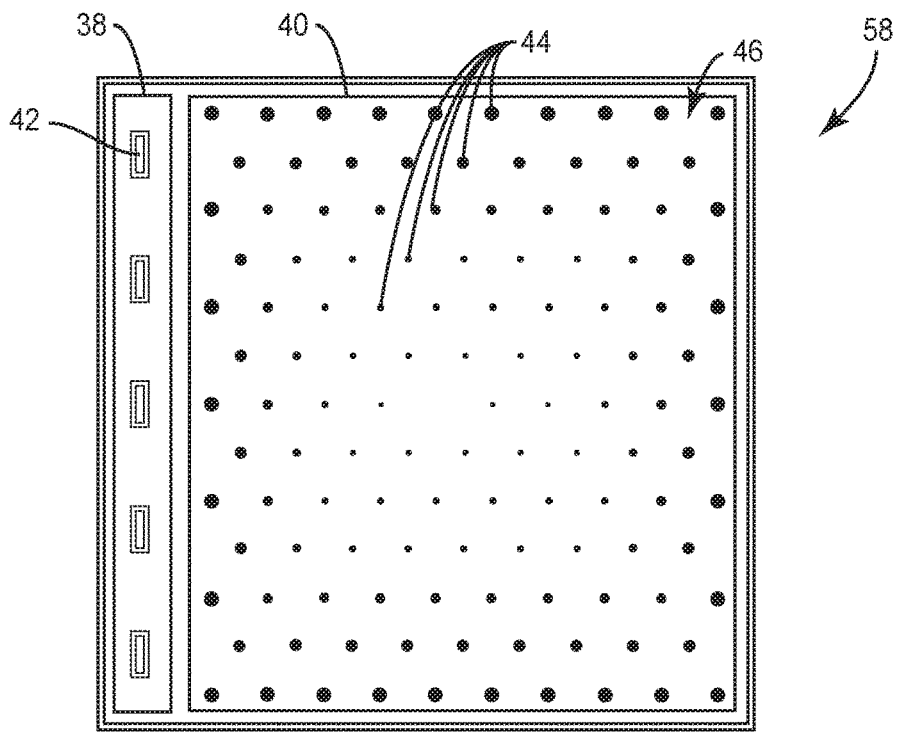
FIG. 13A is a bottom view of the mounting face of an LED chip that includes n-contact interconnects with diameters that vary or change based on locations within the LED chip.

FIG. 13A is a bottom view of the mounting face 46 of an LED chip 58 that includes n-contact interconnects 44 with diameters that vary or change based on locations within the LED chip 58. The n-contact 40, the p-contact 38, and the p-contact interconnects 42 are visible from the mounting face 46 as previously described. In FIG. 13A, different ones of the n-contact interconnects 44 are configured with different diameters based on their locations within the LED chip 58. In certain embodiments, the diameters of the n-contact interconnects 44 progressively decrease from perimeters of the LED chip 58 toward the center of the LED chip 58. Current densities for LED chips can sometimes be higher in and around the centers of LED chips when viewed in top or bottom plan views. In this regard, brightness intensities tend to be highest from the centers of the LED chips. In having the diameters of the n-contact interconnects 44 largest along the perimeter and smallest in the center of the LED chip 58, the n-contact interconnects 44 may accordingly be configured to inject more current in areas that otherwise would experience the lowest current densities. In this regard, current density and brightness uniformity across the LED chip 58 may be improved. In certain embodiments, the n-contact interconnects 44 may comprise a certain diameter in a particular area of the LED chip 58, and a different diameter in a different area of the LED chip 58. In further embodiments, the n-contact interconnects 44 may comprise a same diameter in a particular area of the LED chip 58, and a range of different diameters in a different area of the LED chip 58.

Figure 13B:
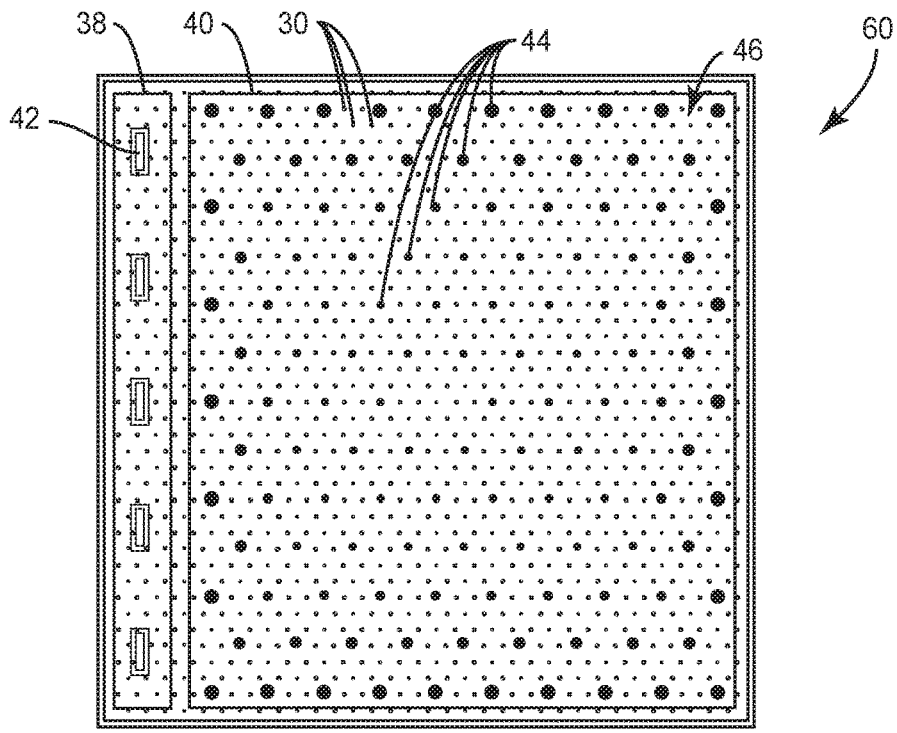
FIG. 13B is a bottom view of the mounting face of an LED chip that is similar to the LED chip of FIG. 13A and further includes reflective layer interconnects.

FIG. 13B is a bottom view of the mounting face 46 of an LED chip 60 that is similar to the LED chip 58 of FIG. 13A and further includes reflective layer interconnects 30. As previously described, the n-contact 40, the p-contact 38, and the p-contact interconnects 42 are visible from the mounting face 46. In FIG. 13B, the n-contact interconnects 44 are configured with different diameters based on their location within the LED chip 60 as previously described. Additionally, the reflective layer interconnects 30, together with the n-contact interconnects 44 collectively form a symmetric pattern as previously described.

As disclosed herein, LED chips may include a plurality of first interconnects electrically connected to an n-type layer and a plurality of second interconnects electrically connected to a p-type layer. In certain embodiments, the plurality of first interconnects and the plurality of second interconnects collectively form a symmetric pattern across an area of the LED chip. The symmetric pattern may extend across a partial area or an entire area of the LED chip. In certain embodiments, the symmetric pattern extends across a partial area of the LED chip and in a different area of the same LED chip, the first interconnects and the second interconnects collectively form an asymmetric pattern. As also disclosed herein, diameters of one or both of the first interconnects and the second interconnects may vary across an LED chip. In particular, the same LED chip may include a particular area where either the first or second interconnects have the same diameter, and another area where either the first or second interconnects have different diameters. As further disclosed herein, combinations of symmetric and asymmetric patterns together with combinations of different interconnect diameters and spacings may be provided in a same LED chip. For example, a particular LED chip may include an area comprising a symmetric pattern of interconnects having the same diameter and another area comprising an asymmetric pattern of interconnects having different diameters. In another example, a particular LED chip may include an area comprising a symmetric pattern of interconnects having different diameters and another area comprising an asymmetric pattern of interconnects having the same diameter. In another example, a particular LED chip may include an area comprising a symmetric pattern of interconnects having the same diameter and another area comprising the same symmetric pattern but with interconnects having different diameters. In another example, a particular LED chip may include an area comprising an asymmetric pattern of interconnects having the same diameter and another area comprising the same asymmetric pattern of interconnects having different diameters.

Those skilled in the art will recognize improvements and modifications to the preferred embodiments of the present disclosure. All such improvements and modifications are considered within the scope of the concepts disclosed herein and the claims that follow.

What is claimed is:

1. A light emitting diode (LED) chip, comprising:
   an active LED structure comprising an n-type layer, a p-type layer, and an active layer arranged between the n-type layer and the p-type layer;
   a plurality of first interconnects electrically connected to the n-type layer; and
   a plurality of second interconnects electrically connected to the p-type layer, wherein the plurality of first interconnects and the plurality of second interconnects collectively form a symmetric pattern across an area of the LED chip, and wherein diameters of the plurality of second interconnects are different based on a relative position of each individual second interconnect to an individual first interconnect of the plurality of first interconnects.

2. The LED chip of claim 1, further comprising an n-contact electrically connected to the n-type layer, wherein the plurality of first interconnects comprise a plurality of n-contact interconnects that are electrically connected between the n-contact and the n-type layer.

3. The LED chip of claim 1, further comprising a reflective structure on the p-type layer, wherein the reflective structure comprises a dielectric layer and a metal layer, and the plurality of second interconnects comprise a plurality of reflective layer interconnects that extend through a portion of the dielectric layer.

4. The LED chip of claim 1, wherein the plurality of first interconnects are arranged to be evenly spaced from one another in a first pattern across the area of the LED chip and the plurality of second interconnects are arranged to be evenly spaced from one another in a second pattern across the area of the LED chip.

5. The LED chip of claim 4, wherein the first pattern and the second pattern collectively form the symmetric pattern across the LED chip.

6. The LED chip of claim 1, wherein a diameter of an individual second interconnect that is arranged closest to a particular first interconnect is larger than a diameter of another individual second interconnect that is arranged farther from the particular first interconnect.

7. The LED chip of claim 1, wherein a diameter of an individual second interconnect that is arranged closest to a particular first interconnect is smaller than a diameter of another individual second interconnect that is arranged farther from the particular first interconnect.

8. The LED chip of claim 1, wherein diameters of the plurality of first interconnects are different based on a relative position of each individual first interconnect across the area of the LED chip.

9. The LED chip of claim 1, wherein diameters of the plurality of first interconnects progressively decrease in a direction from a perimeter of the LED chip toward a center of the LED chip.

10. The LED chip of claim 1, wherein the plurality of first interconnects and the plurality of second interconnects collectively form an asymmetric pattern in a different area of the LED chip.

11. A light emitting diode (LED) chip, comprising:
an active LED structure comprising an n-type layer, a p-type layer, and an active layer arranged between the n-type layer and the p-type layer;
a plurality of first interconnects electrically connected to the n-type layer; and
a plurality of second interconnects electrically connected to the p-type layer, the plurality of second interconnects comprising diameters that vary within in a range of 2 microns to 15 microns;
wherein a center point of each of the plurality of first interconnects and a center point of each of the plurality of second interconnects form an array of equally spaced center points across the LED chip.

12. The LED chip of claim 11, further comprising an n-contact electrically connected to the n-type layer, wherein the plurality of first interconnects comprise a plurality of n-contact interconnects that are electrically connected between the n-contact and the n-type layer.

13. The LED chip of claim 11, further comprising a reflective structure on the p-type layer, wherein the reflective structure comprises a dielectric layer and a metal layer, and the plurality of second interconnects comprise a plurality of reflective layer interconnects that extend through a portion of the dielectric layer.

14. The LED chip of claim 11, wherein each of the plurality of first interconnects comprises a same diameter that is in a range of 4 microns to 25 microns.

15. The LED chip of claim 11, wherein the plurality of first interconnects comprise diameters that vary within in a range of 4 microns to 25 microns.

16. The LED chip of claim 11, wherein each of the plurality of second interconnects comprises a same diameter that is in a range of 2 microns to 15 microns.

17. A light emitting diode (LED) chip, comprising:
an active LED structure comprising an n-type layer, a p-type layer, and an active layer arranged between the n-type layer and the p-type layer;
a first interconnect electrically connected to the n-type layer; and
a plurality of second interconnects electrically connected to the p-type layer;
wherein diameters of at least some second interconnects of the plurality of second interconnects progressively decrease and increase with increasing distance away from the first interconnect.

18. The LED chip of claim 17, further comprising a plurality of first interconnects that are arranged to be evenly spaced from one another in a first pattern across an area of the LED chip and the plurality of second interconnects are arranged to be unevenly spaced from one another across the area of the LED chip.

19. The LED chip of claim 17, further comprising a plurality of first interconnects, wherein diameters of the plurality of first interconnects are different based on a relative position of each individual first interconnect across an area of the LED chip.

20. A light emitting diode (LED) chip, comprising:
an active LED structure comprising an n-type layer, a p-type layer, and an active layer arranged between the n-type layer and the p-type layer;
a first interconnect electrically connected to the n-type layer;
a plurality of second interconnects electrically connected to the p-type layer; and
a reflective structure on the p-type layer, wherein the reflective structure comprises a dielectric layer and a metal layer, and the plurality of second interconnects comprise a plurality of reflective layer interconnects that extend through a portion of the dielectric layer;
wherein spacings between adjacent second interconnects of the plurality of second interconnects are different based on a relative position of each second interconnect to the first interconnect.

21. The LED chip of claim 20, wherein the first interconnect is one of a plurality of first interconnects.

22. The LED chip of claim 21, wherein the plurality of first interconnects and the plurality of second interconnects collectively form a symmetric pattern across an area of the LED chip.

23. The LED chip of claim 21, wherein the plurality of first interconnects and the plurality of second interconnects collectively form an asymmetric pattern across an area of the LED chip.

* * * * *